(12) United States Patent
Zhao et al.

(10) Patent No.: US 7,808,087 B2
(45) Date of Patent: Oct. 5, 2010

(54) LEADFRAME IC PACKAGES HAVING TOP AND BOTTOM INTEGRATED HEAT SPREADERS

(75) Inventors: Sam Ziqun Zhao, Irvine, CA (US);
Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 424 days.

(21) Appl. No.: 11/527,573

(22) Filed: Sep. 27, 2006

(65) Prior Publication Data

US 2007/0278632 A1 Dec. 6, 2007

Related U.S. Application Data

(60) Provisional application No. 60/803,681, filed on Jun. 1, 2006.

(51) Int. Cl.
*H01L 23/495* (2006.01)
(52) U.S. Cl. ............................ 257/670; 257/E23.054
(58) Field of Classification Search ................. 257/670
See application file for complete search history.

(56) References Cited

U.S. PATENT DOCUMENTS

| | | | |
|---|---|---|---|
| 4,480,262 A | 10/1984 | Butt | |
| 4,560,826 A | 12/1985 | Burns et al. | |
| 4,680,613 A | 7/1987 | Daniels et al. | |
| 4,803,544 A | 2/1989 | Holzschuh et al. | |
| 5,105,260 A | 4/1992 | Butera | |
| 5,153,379 A | 10/1992 | Guzuk et al. | |
| 5,294,826 A * | 3/1994 | Marcantonio et al. | ....... 257/659 |
| 5,350,943 A | 9/1994 | Angerstein et al. | |
| 5,376,756 A | 12/1994 | Kwon | |
| 5,378,656 A * | 1/1995 | Kajihara et al. | ............... 29/827 |
| 5,389,816 A | 2/1995 | Shimizu et al. | |
| 5,406,117 A | 4/1995 | Dlugokecki et al. | |

(Continued)

FOREIGN PATENT DOCUMENTS

DE 197 00 056 A1 3/1996

(Continued)

OTHER PUBLICATIONS

European Search Report issued in EP Appl. No. 07004088.6-1235 on Aug. 21, 2008, (4 pages).

(Continued)

*Primary Examiner*—Benjamin P Sandvik
(74) *Attorney, Agent, or Firm*—Sterne, Kessler, Goldstein & Fox PLLC

(57) ABSTRACT

Methods and apparatus for improved thermal performance and electromagnetic interference (EMI) shielding in integrated circuit (IC) packages is described. A die-up or die-down package includes first and second caps defining a cavity, an IC die, and a leadframe. The leadframe includes a centrally located die attach pad, a plurality of leads, and a plurality of tie bars that couple the die attach pad to the leads. The IC die is mounted to the die attach pad. Planar rim portions of the first and second caps that surround the cavity are coupled to the leadframe. The first and second caps and the leadframe form an enclosure structure that substantially encloses the IC die, and shields EMI emanating from and radiating towards the IC die. The enclosure structure also dissipates heat generated by the IC die during operation.

30 Claims, 43 Drawing Sheets

U.S. PATENT DOCUMENTS

| | | | |
|---|---|---|---|
| 5,457,341 | A | 10/1995 | West |
| 5,468,910 | A | 11/1995 | Knapp et al. |
| 5,486,720 | A | 1/1996 | Kierse |
| 5,497,032 | A | 3/1996 | Tsuji et al. |
| 5,559,306 | A * | 9/1996 | Mahulikar ............... 174/538 |
| 5,608,265 | A | 3/1997 | Kitano et al. |
| 5,614,761 | A * | 3/1997 | Kanekawa et al. .......... 257/676 |
| 5,642,261 | A | 6/1997 | Bond et al. |
| 5,650,659 | A * | 7/1997 | Mostafazadeh et al. ..... 257/660 |
| 5,668,406 | A | 9/1997 | Egawa |
| 5,691,567 | A | 11/1997 | Lo et al. |
| 5,703,398 | A * | 12/1997 | Sono et al. ............... 257/706 |
| 5,723,899 | A * | 3/1998 | Shin ........................ 257/666 |
| 5,825,042 | A * | 10/1998 | Strobel et al. ............ 250/515.1 |
| 5,889,316 | A | 3/1999 | Strobel et al. |
| 5,977,626 | A | 11/1999 | Wang et al. |
| 5,986,340 | A | 11/1999 | Mostafazadeh et al. |
| 6,011,303 | A | 1/2000 | Tanaka et al. |
| 6,092,281 | A | 7/2000 | Glenn |
| 6,221,702 | B1 | 4/2001 | Joo et al. |
| 6,229,702 | B1 | 5/2001 | Tao et al. |
| 6,395,582 | B1 | 5/2002 | Sohn et al. |
| 6,432,742 | B1 | 8/2002 | Guan et al. |
| 6,501,184 | B1 | 12/2002 | Shin et al. |
| 6,528,876 | B2 | 3/2003 | Huang |
| 6,552,428 | B1 | 4/2003 | Huang et al. |
| 6,614,102 | B1 * | 9/2003 | Hoffman et al. ............ 257/666 |
| 6,617,200 | B2 | 9/2003 | Sone |
| 6,707,140 | B1 | 3/2004 | Nguyen et al. |
| 6,737,750 | B1 | 5/2004 | Hoffman et al. |
| 6,775,140 | B2 | 8/2004 | Shim et al. |
| 6,825,108 | B2 | 11/2004 | Khan et al. |
| 6,838,761 | B2 | 1/2005 | Karnezos |
| 6,848,912 | B2 | 2/2005 | Zhang |
| 6,853,070 | B2 | 2/2005 | Khan et al. |
| 6,861,750 | B2 | 3/2005 | Zhao et al. |
| 6,876,553 | B2 | 4/2005 | Zhao et al. |
| 6,879,039 | B2 | 4/2005 | Khan et al. |
| 6,882,042 | B2 | 4/2005 | Zhao et al. |
| 6,887,741 | B2 | 5/2005 | Zhao et al. |
| 6,906,414 | B2 | 6/2005 | Zhao et al. |
| 6,919,630 | B2 | 7/2005 | Hsiao |
| 6,989,593 | B2 | 1/2006 | Khan et al. |
| 7,005,737 | B2 | 2/2006 | Zhao et al. |
| 7,015,072 | B2 | 3/2006 | Combs et al. |
| 7,015,379 | B2 | 3/2006 | Hood et al. |
| 7,026,711 | B2 | 4/2006 | Lee et al. |
| 7,038,312 | B2 | 5/2006 | Khan et al. |
| 7,057,277 | B2 | 6/2006 | Chen et al. |
| 7,061,102 | B2 | 6/2006 | Eghan et al. |
| 7,078,806 | B2 | 7/2006 | Khan et al. |
| 7,094,060 | B2 | 8/2006 | Zhang |
| 7,102,225 | B2 | 9/2006 | Khan et al. |
| 7,132,744 | B2 | 11/2006 | Zhao et al. |
| 7,148,084 | B2 * | 12/2006 | Strobel et al. ............... 438/115 |
| 7,161,239 | B2 | 1/2007 | Zhao et al. |
| 7,168,957 | B2 | 1/2007 | Zhang |
| 7,196,415 | B2 | 3/2007 | Zhong et al. |
| 7,198,987 | B1 | 4/2007 | Warren et al. |
| 7,202,559 | B2 | 4/2007 | Zhao et al. |
| 7,227,256 | B2 | 6/2007 | Zhao et al. |
| 7,241,645 | B2 | 7/2007 | Zhao et al. |
| 7,245,500 | B2 | 7/2007 | Khan et al. |
| 7,259,445 | B2 | 8/2007 | Lau et al. |
| 7,259,448 | B2 | 8/2007 | Zhang et al. |
| 7,259,457 | B2 | 8/2007 | Zhang et al. |
| 7,271,479 | B2 | 9/2007 | Zhao et al. |
| 7,312,108 | B2 | 12/2007 | Zhao et al. |
| 7,326,061 | B2 | 2/2008 | Zhang |
| 2002/0024137 | A1 | 2/2002 | Olofsson et al. |
| 2002/0079572 | A1 | 6/2002 | Khan et al. |
| 2002/0098617 | A1 | 7/2002 | Lee et al. |
| 2002/0190361 | A1 | 12/2002 | Zhao et al. |
| 2003/0025089 | A1 | 2/2003 | Featherby et al. |
| 2003/0057550 | A1 | 3/2003 | Zhao et al. |
| 2003/0111728 | A1 | 6/2003 | Thai et al. |
| 2003/0146509 | A1 | 8/2003 | Zhao et al. |
| 2003/0178719 | A1 | 9/2003 | Combs et al. |
| 2004/0038447 | A1 | 2/2004 | Corisis et al. |
| 2004/0084771 | A1 | 5/2004 | Bolken et al. |
| 2004/0178499 | A1 | 9/2004 | Mistry et al. |
| 2005/0012203 | A1 | 1/2005 | Rahman Khan et al. |
| 2005/0029657 | A1 | 2/2005 | Khan et al. |
| 2005/0035452 | A1 | 2/2005 | Zhang et al. |
| 2005/0077545 | A1 | 4/2005 | Zhao et al. |
| 2005/0127501 | A1 | 6/2005 | Khan et al. |
| 2005/0199987 | A1 | 9/2005 | Danno et al. |
| 2005/0280127 | A1 * | 12/2005 | Zhao et al. .................. 257/678 |
| 2005/0280139 | A1 | 12/2005 | Zhao et al. |
| 2005/0280141 | A1 | 12/2005 | Zhang |
| 2006/0012037 | A1 | 1/2006 | Raedt et al. |
| 2006/0065972 | A1 | 3/2006 | Khan et al. |
| 2006/0091542 | A1 | 5/2006 | Zhao et al. |
| 2006/0166397 | A1 | 7/2006 | Lau et al. |
| 2007/0007644 | A1 | 1/2007 | Zhao et al. |
| 2007/0045824 | A1 | 3/2007 | Zhao et al. |
| 2007/0090502 | A1 * | 4/2007 | Zhao et al. .................. 257/675 |
| 2007/0108598 | A1 | 5/2007 | Zhong et al. |
| 2007/0200210 | A1 | 8/2007 | Zhao et al. |
| 2007/0267734 | A1 * | 11/2007 | Zhao et al. .................. 257/687 |
| 2007/0267740 | A1 | 11/2007 | Khan et al. |
| 2007/0273023 | A1 | 11/2007 | Zhao et al. |
| 2007/0273049 | A1 | 11/2007 | Khan et al. |
| 2007/0278632 | A1 | 12/2007 | Zhao et al. |
| 2007/0290322 | A1 | 12/2007 | Zhao et al. |
| 2007/0290376 | A1 | 12/2007 | Zhao et al. |
| 2008/0006934 | A1 | 1/2008 | Zhao et al. |

FOREIGN PATENT DOCUMENTS

| | | |
|---|---|---|
| EP | 0 573 297 A2 | 12/1993 |
| GB | 1 306 031 | 2/1973 |
| JP | 63-15448 | 1/1988 |
| KR | 1999-0019837 | 6/1999 |

OTHER PUBLICATIONS

C.A. Happer, Electronic Packaging and Interconnection Handbook, 3rd Edition, McGraw-Hill, New York, pp. 7.61-7.67, 2000.

Office Action cited in U.S. Appl. No. 11/253,714, filed Oct. 20, 2005, dated May 1, 2008.

Office Action cited in U.S. Appl. No. 11/253,714, filed Oct. 20, 2005, dated Dec. 10, 2008.

Office Action Communication cited in U.S. Appl. No. 11/253,714, filed Oct. 20, 2005, dated Feb. 2, 2009.

Esp@cenet Database, English language abstract of JP 63-15448 (listed as document FP1 On the accompanying form PTO/SB/08A), Jan. 22, 1988.

English Translation of Abstract for KR 1999-0019837 (listed as document FP2 On the accompanying form PTO/SB/08A).

* cited by examiner

600

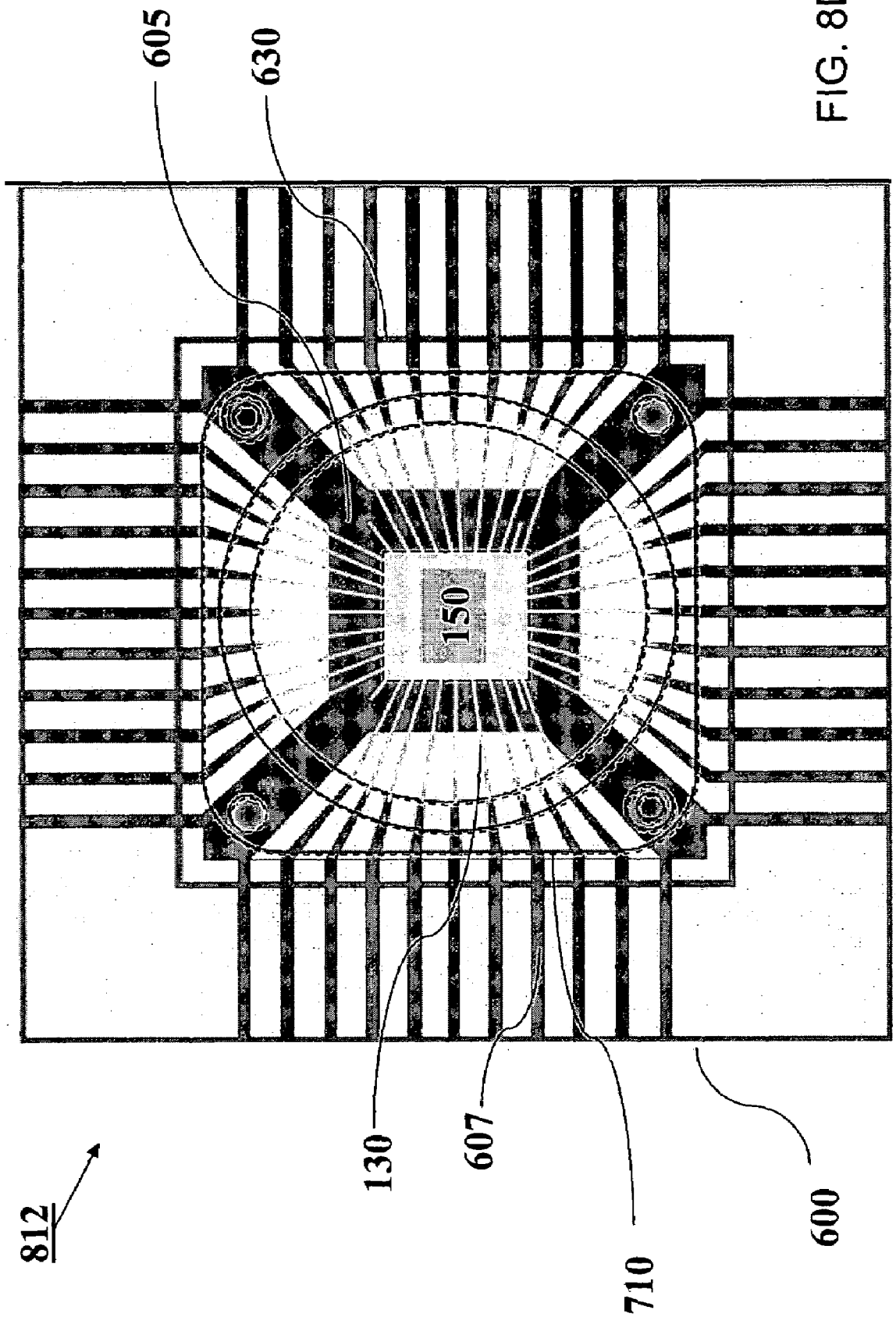

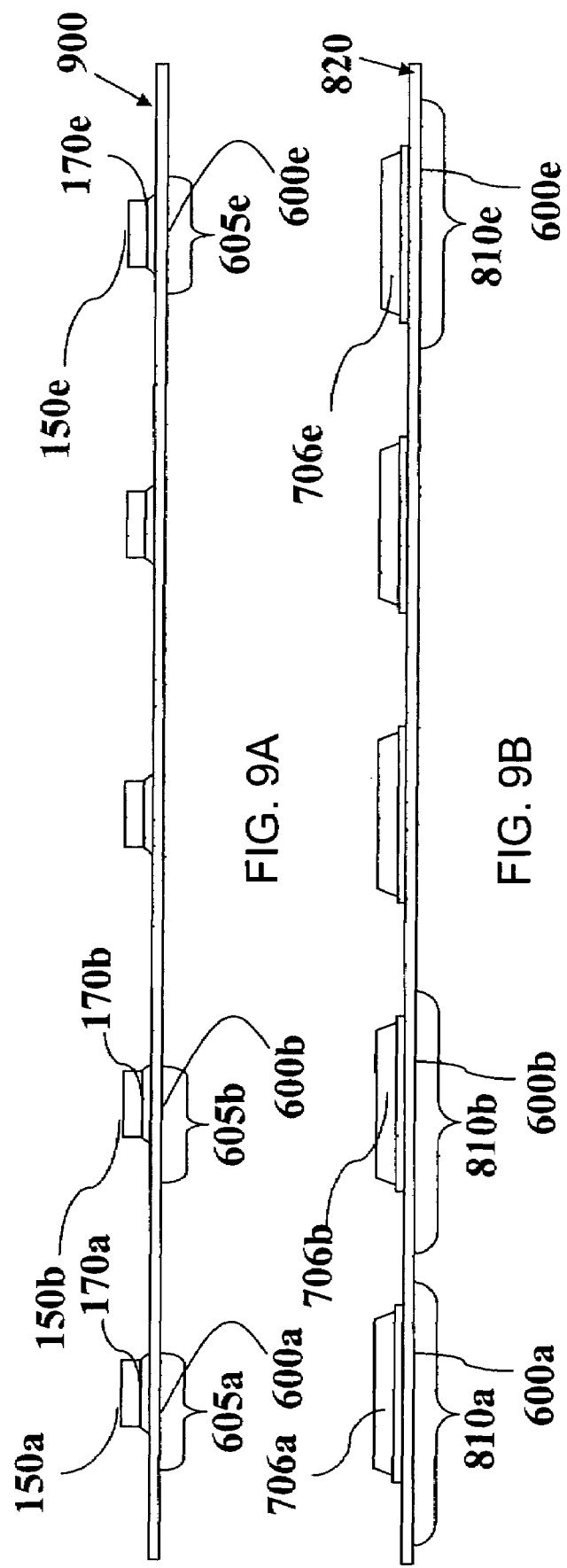

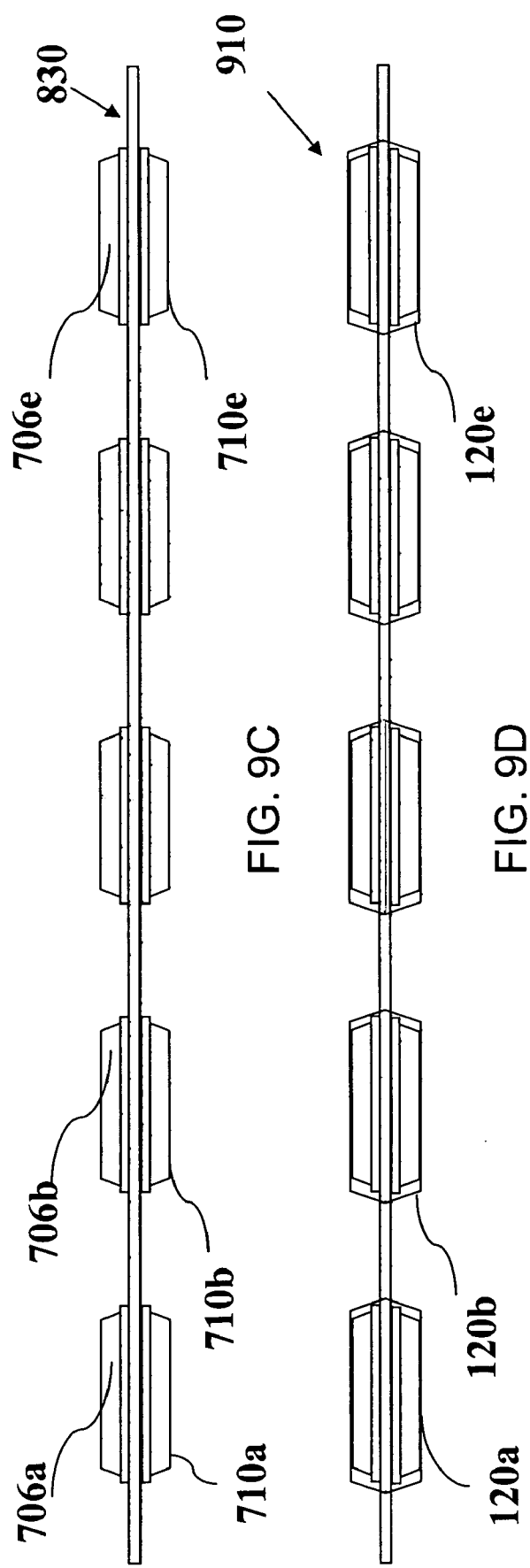

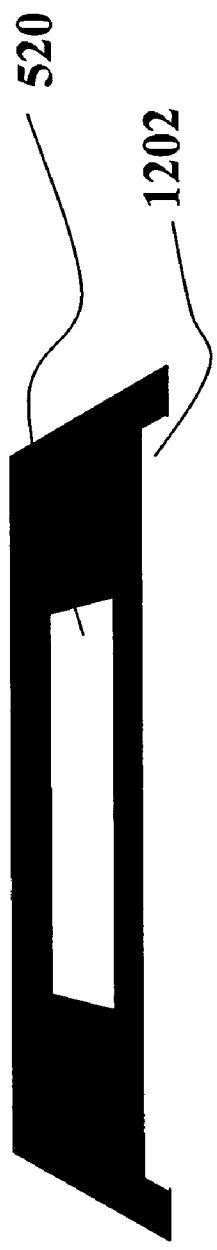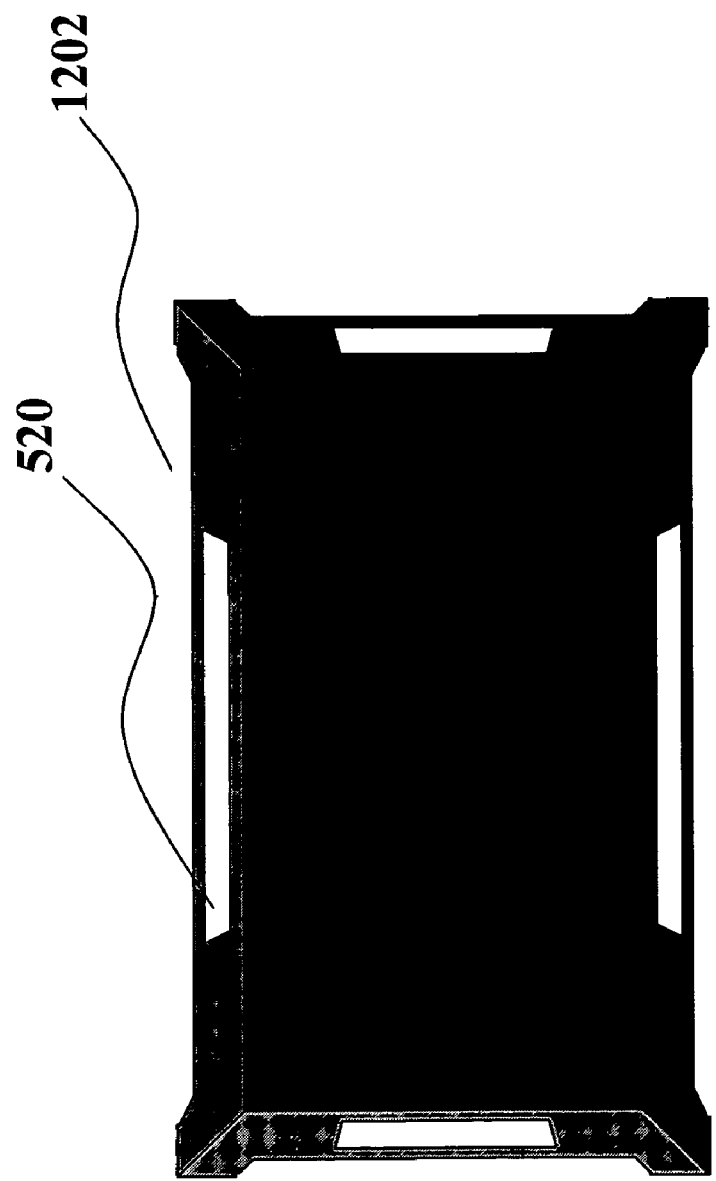

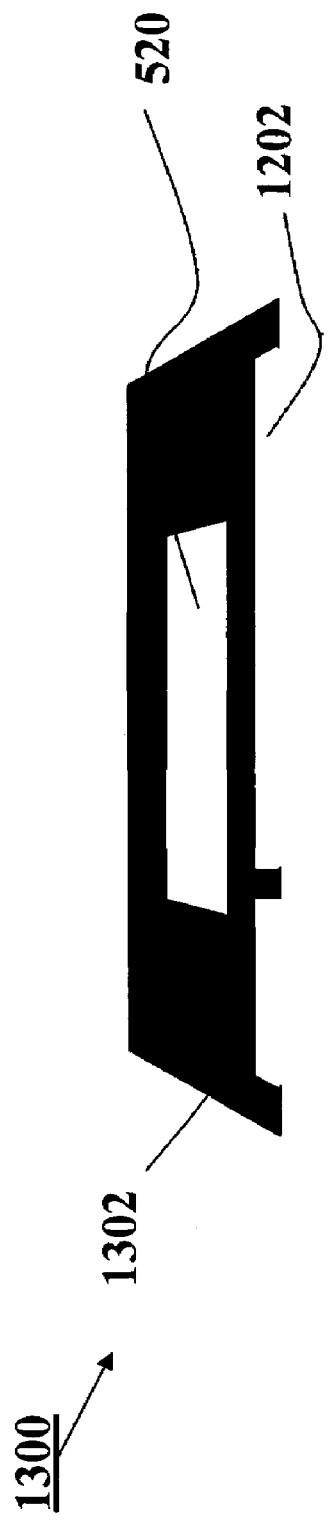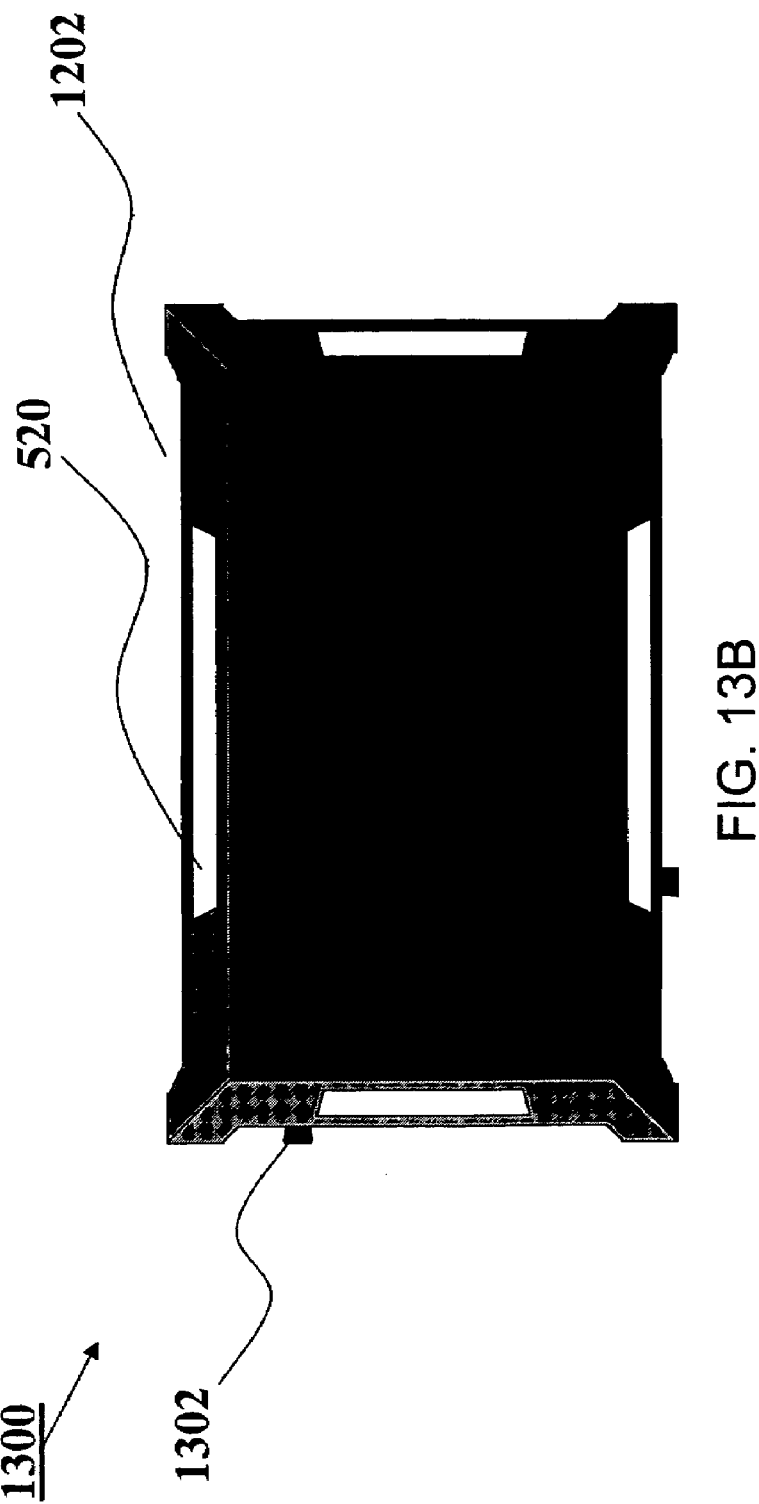

LEADFRAME IC PACKAGES HAVING TOP AND BOTTOM INTEGRATED HEAT SPREADERS

CROSS-REFERENCE TO RELATED APPLICATIONS

The present application claims the benefit of U.S. Prov. Appl. No. 60/803,681, filed Jun. 1, 2006, which is incorporated by reference herein in its entirety.

The following patent application of common assignee is herein incorporated by reference in its entirety: "Methods and Apparatus for Improved Thermal Performance and Electromagnetic Interference (EMI) Shielding in Leadframe Integrated Circuit Packages", U.S. patent application Ser. No. 11/253,714 filed Oct. 20, 2005.

BACKGROUND OF THE INVENTION

1. Field of the Invention

The invention relates generally to the field of integrated circuit (IC) device packaging technology and, more particularly to thermal enhancement and electromagnetic interference (EMI) shielding in IC device leadframe packages.

2. Background

Integrated circuit semiconductor chips or dies are typically mounted in or on a package that is attached to a printed circuit board (PCB). Leadframes are widely used in IC packages as a carrier for the IC die and as an interconnection mechanism between the die and the electrical circuits of the PCB. Various leadframe packages have been developed and package family outlines have been standardized by the Electronic Industries Alliance (EIA), the Joint Electron Device Engineering Council (JEDEC), and the Electronic Industries Alliance of Japan (EIAJ).

However, commercially available leadframe packages have poor thermal performance and EMI shielding. Thus, what is needed is reduced EMI susceptibility and emission, in combination with improved thermal and electrical performances in integrated circuit packages.

BRIEF SUMMARY OF THE INVENTION

The present invention is directed to methods and apparatus for improved thermal performance and EMI shielding in IC packages.

In an aspect of the present invention, a leadframe IC device package includes first and second heat spreader caps ("caps") having opposing first and second surfaces. A first portion of the second surface of the first cap has a cavity formed therein. A planar second portion of the second surface of the first cap is coupled to a first surface of a leadframe. The leadframe includes a die attach pad (DAP), a plurality of leads, and a plurality of tie bars coupled to the DAP. At least one IC die is mounted to the die attach pad on the first surface of the leadframe. Similarly, the second cap is attached to a second surface of the leadframe such that the leadframe is between the first and second caps, one of which is nearer to the printed circuit board. The first and second caps and the leadframe form an enclosure structure that substantially encloses the IC die(s).

In another aspect of the present invention, an IC device package is assembled. A leadframe is formed. At least one IC die is attached to a die attach pad portion of a first surface of the leadframe. Wire bonds are coupled between the IC die and the leadframe. First and second caps are attached to the opposing first and second surfaces of the leadframe. The first and second caps and leadframe form an enclosure structure that substantially encloses the IC die. The enclosure structure maybe filled with an encapsulating material to encapsulate at least the IC die or may be filled with inert gases like neon. A perimeter support ring portion of the leadframe is trimmed. Portions of the leads are bent to form shoulder bends, to aid coupling of ends of the leads to a circuit board. The enclosure structure spreads heat from the IC die(s) during operation. Furthermore, the enclosure structure shields EMI emanating from the IC die(s) and EMI radiating toward the IC die(s) from outside the package.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 8A-8E show plan views of examples of leadframe IC packages undergoing assembly, according to embodiments of the invention.

FIGS. 9A-9D show side views of examples of leadframe IC packages undergoing assembly, according to embodiments of the invention.

FIGS. 12A and 12B show horizontal and top views respectively of an inverted cup design for a cap.

FIGS. 13A and 13B show horizontal and top views respectively of a cap with contact stands with fused leads.

Figure 1:
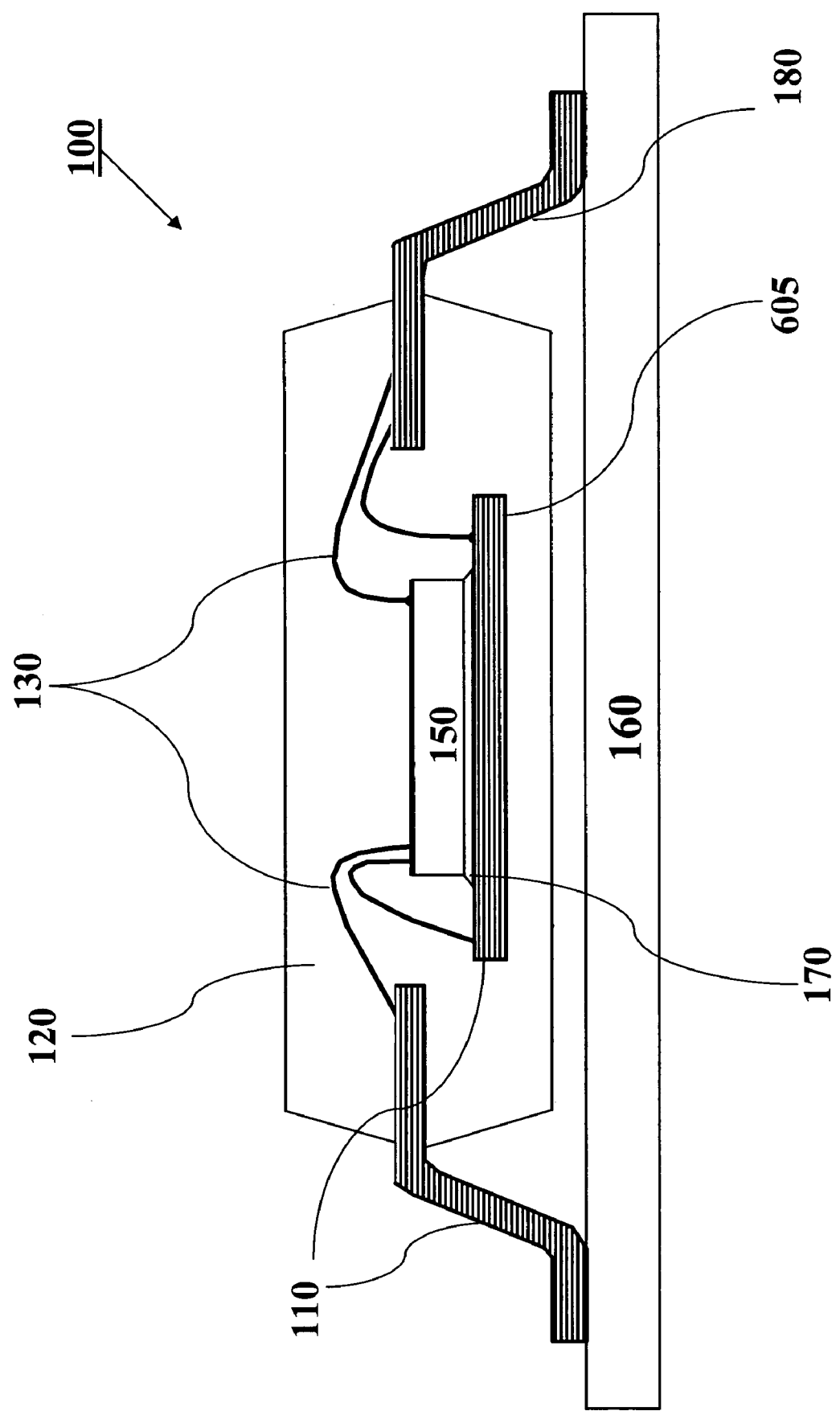
FIG. 1 illustrates a typical conventional plastic quad flat package (PQFP).

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The present invention is directed to methods and apparatuses for integrated circuit (IC) packages with respect to improving thermal performance, electromagnetic interference (EMI) shielding performance, and/or enhancement of environmental protection. In embodiments of the invention, an IC die is mounted to a die attach pad (DAP) in the center of a leadframe that includes leads along its peripheral. In an embodiment, the package is configured in a die-up configuration. In another embodiment, the package is configured in a die-down configuration.

In embodiments of the invention, metal heat spreaders ("caps") are coupled (e.g. electrically, structurally, and/or thermally connected) to the leadframe to form an enclosure structure. In an embodiment, the coupling may be effected with or without the use of a thermally and/or electrically conductive adhesive, such as solder or epoxy with metal particles or flakes. In an embodiment, the caps are coupled to the leadframe tie bars. The leadframe tie bars may be widened or fused to leads of the leadframe. In another embodiment, the caps are directly coupled to the leads. In yet another embodiment, the caps are coupled to the DAP. The caps may be coupled with any combination of DAP, leads, and tie bars. In an embodiment, tabs on the caps mate with matching receptacles on the leadframe to improve coupling and overall structural strength. Wire bonds may be used to electrically connect die to leads of the leadframe and/or to the DAP.

The enclosure structure formed by the two caps and a leadframe approximate an equipotential surface, or Faraday Cage, surrounding the die and corresponding interconnections. In an embodiment, the enclosure structure material is also a very good conductor of heat and is relatively rigid (e.g., copper or copper alloy such as C194, C151, C7025, or EFTEC/64T). The enclosure structure may provide improved EMI shielding, improved heat transfer from the one or more die, enhanced rigidity of the package, and improved environmental (e.g., mechanical shock, vibration, impact, stress, temperature, moisture, corrosion, etc.) protection.

In an embodiment, the die and the wirebonds are encapsulated in an encapsulating material, such as a molding compound, which provides environmental protection. The encapsulating material may also completely cover the caps. In other embodiments, the caps are partially covered, or are not covered by the encapsulating material.

In another embodiment, the die and the wirebonds are encapsulated in the enclosure structure, as described above. The cavity thus formed is filled with an inert gas such as neon to provide environmental protection.

In an embodiment of the invention, one or both of the metal caps is coupled with an external heat sink, to further enhance the thermal performance of the package.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Example Integrated Circuit Packages

FIG. 1 shows a cross-sectional view of a plastic quad flat package (PQFP) 100. An IC die 150 is attached with thermally and/or electrically conductive adhesive 170 to a die attach pad (DAP) 140 portion of a typically copper or copper alloy leadframe 110. Wirebonds 130 form electrical interconnections between die 150, DAP, and leadframe leads 180. IC die 150 and wirebonds 130 are molded in encapsulating material 120 for environmental protection, which is typically plastic. Leads 180 (if any) can be straight or bent and extend from one or more sides of package 100. Different families of leadframe packages are further discussed in C. A. Happer, Electronic Packaging and Interconnection Handbook, $3^{rd}$ edition, McGraw-Hill, New York, pp. 7.61-7.67, 2000, which is incorporated by reference herein in its entirety.

Figure 2:
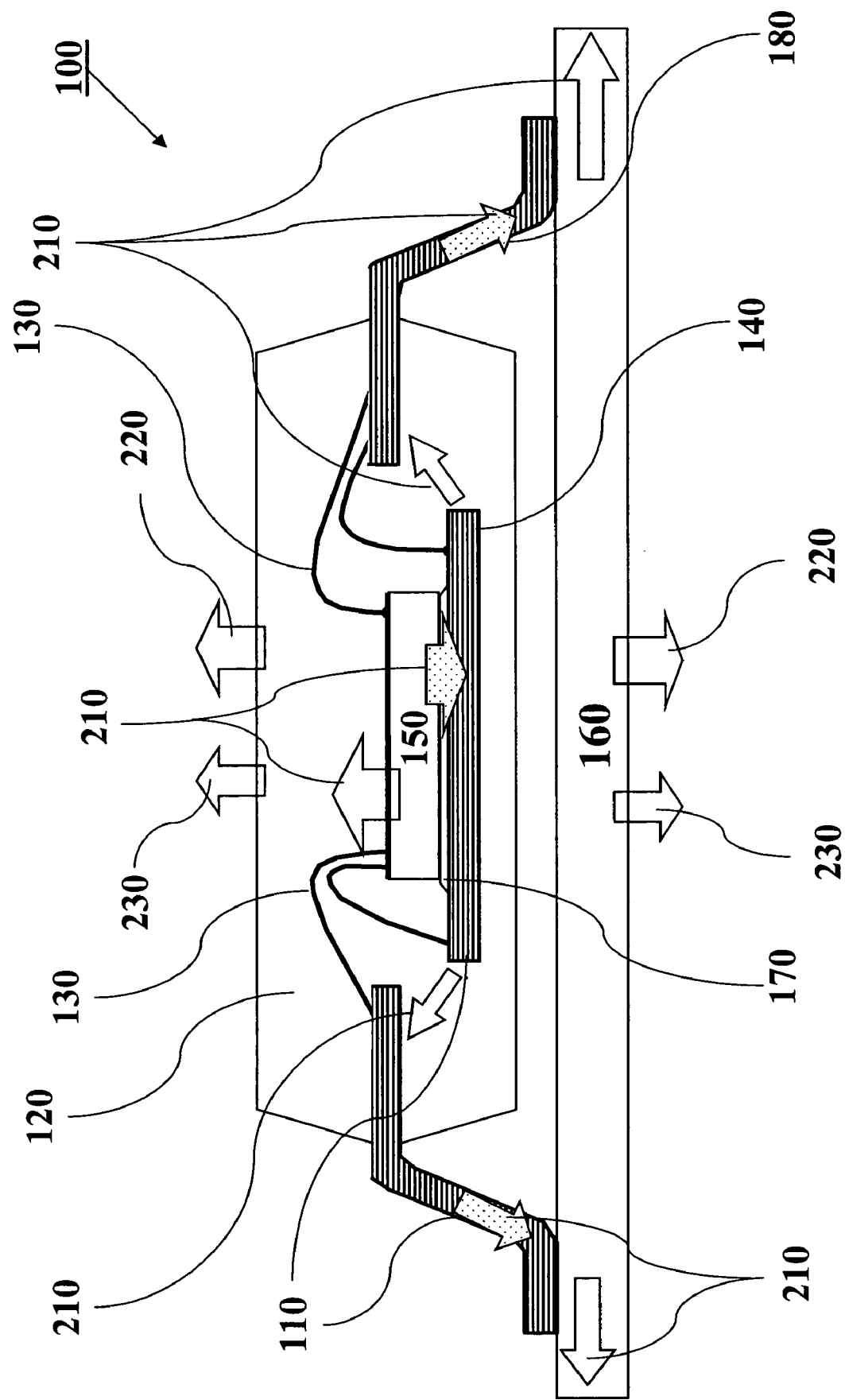
FIG. 2 illustrates example heat dissipation paths in and from a typical PQFP.

Plastic molding compound encapsulated leadframe packages 100 commonly exhibit poor thermal performance. In leadframe package 100, DAP is typically separated from leadframe leads 180 that extend beyond encapsulating material 120. Heat dissipation paths in and from plastic quad flat pack (PQFP) package 100 are shown in FIG. 2. Heat generated on the active surface of die 150 is conducted via paths 210 into encapsulating material 120 and leadframe 110. Leadframe 110 conducts some heat into a circuit board 160 to which package 100 is attached. Encapsulating material 120 transfers heat to the environment through convection path 220 and radiation path 230. Typical encapsulating materials 120 have a low thermal conductivity value, such as around or between 0.2~0.9 W/m·K. Therefore, the temperature of die 150 must rise to a relatively high value to transfer the heat generated during operation through encapsulating material 120.

In addition, leadframe packages 100 commonly exhibit poor electromagnetic interference (EMI) shielding. A change in the electrical current carried by a conductor results in the radiation of electromagnetic waves. Such waves propagate through space at the speed of light, and when not wanted, are called EMI. A relatively slow change in the electrical current causes a small amount of electromagnetic radiation with a long wavelength and a low frequency. A relatively rapid change in the electrical current causes a large amount of radiation with a short wavelength and a high frequency.

The unwanted high frequency electromagnetic radiation is sometimes called radio-frequency interference (RFI), but in the interest of brevity, this application refers to all unwanted electromagnetic radiation as EMI, regardless of frequency.

IC die 150 are more susceptible to higher frequency EMI. Because higher frequencies are more energetic, they may cause larger voltage swings in the metal traces on an IC die. Because modem IC gates are small in size, they operate with a low signal voltage. Thus, signal line voltage swings caused by high-frequency EMI may cause a change in logic state and may result in timing and logic failures in electronic devices.

Encapsulating materials 120 are typically transparent to electromagnetic radiation. Referring to FIG. 1, the electromagnetic radiation generated by die 150 will escape from package 100 and potentially interfere with the operation of nearby components. Conversely, EMI from nearby components will enter package 100 and may interfere with the operation of die 150.

Figure 3A:
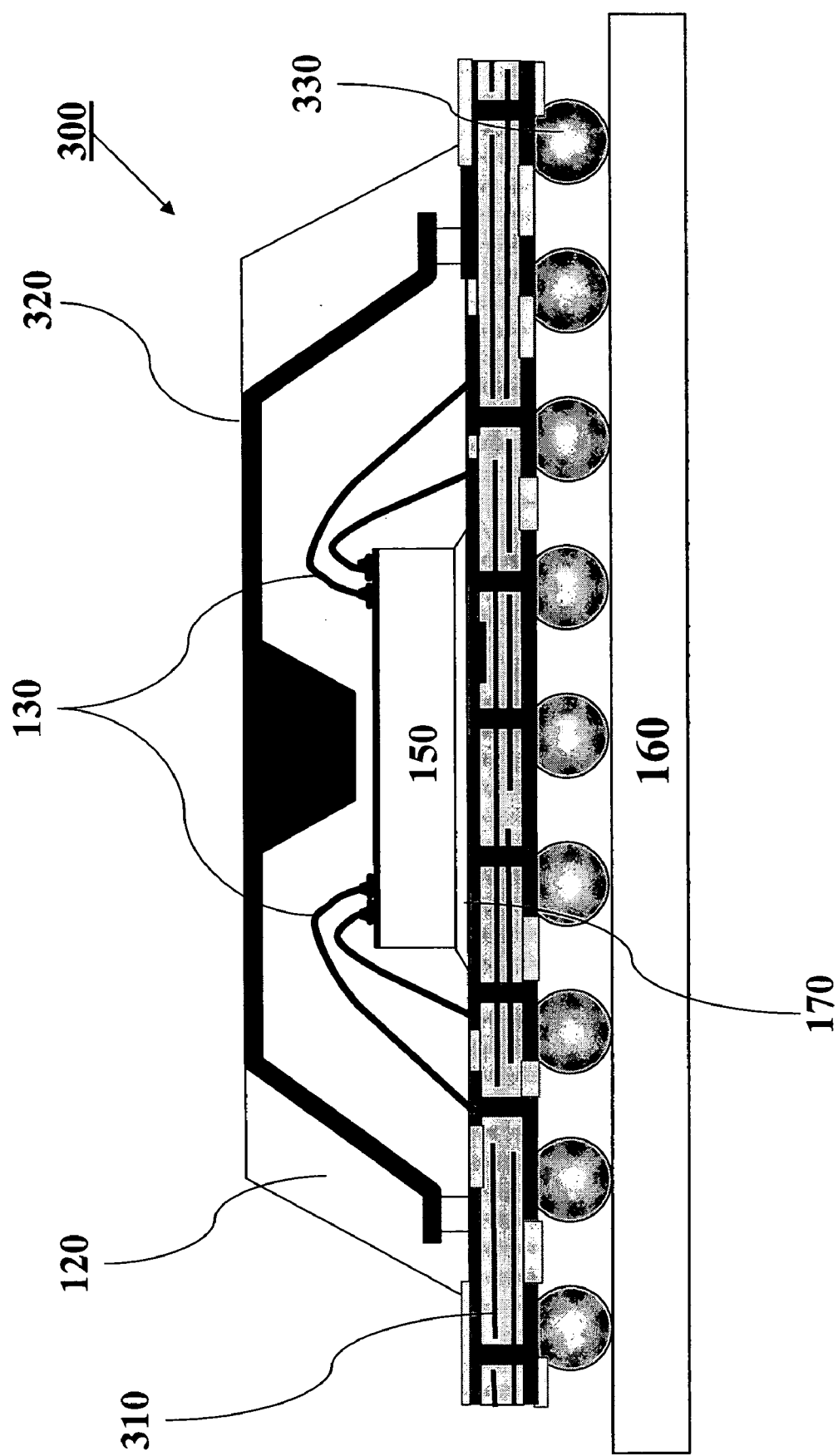
FIGS. 3A-3D illustrate example ball grid array (BGA) integrated circuit (IC) packages.

FIG. 3A illustrates a ball grid array (BGA) package having improved performance. FIG. 3A shows a cross-sectional view of a BGA package 300 with an IC die 150 mounted on a printed circuit substrate 310, encapsulated by a encapsulating material 120, and electrically connected to PCB 160 through solder balls 330. For further detail on a package similar to package 300, see U.S. Pat. No. 5,977,626, "Thermally and Electrically Enhanced PBGA Package," to Wang et al., which is incorporated by reference in its entirety. BGA package 300 includes a drop-in heat spreader 320 to promote dissipation of heat within encapsulating material 120. However, direct contact between IC die 150 and heat spreader 320 is not permitted in package 300. This is to avoid shorting the active surface of IC die 150 and wirebonds 130 with heat spreader 320. Accordingly, heat generated by IC die 150 must pass through encapsulating material 120 in order to reach heat spreader 120, and may therefore remain trapped within BGA package 300. Furthermore, drop-in heat spreader 320 only provides limited EMI shielding, if any. For example, EMI generated outside BGA package 300 can penetrate printed circuit substrate 310 and interfere with the operation of IC die 150. Also, EMI generated by IC die 150 can escape BGA package 300 through trace metal openings or gaps in printed circuit substrate 310.

Figure 3B:
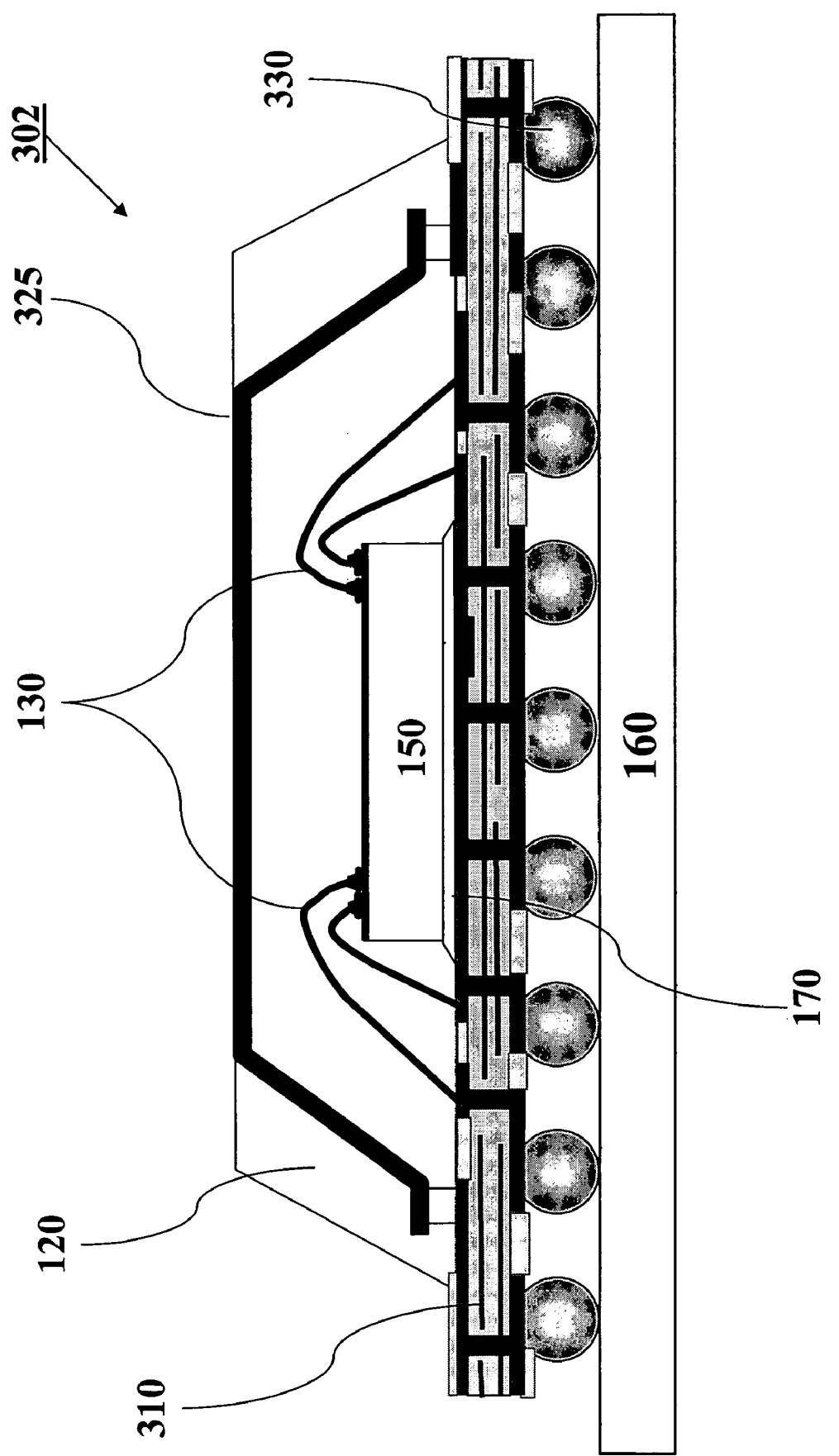

FIG. 3B illustrates a cross-sectional view of a BGA package 302, similar to BGA package 300, but with a differently configured heat spreader 325. For further detail on a package similar to package 302, see U.S. Pat. No. 6,552,428 "Semiconductor Package Having An Exposed Heat Spreader" to Huang et al., which is incorporated by reference herein in its entirety. BGA package 302 suffers from the same thermal and electromagnetic shielding deficiencies as BGA package 300. An encapsulating material 120 and a printed circuit substrate 310 may trap heat generated by an IC die 150 within BGA package 302. EMI generated inside of BGA package by die 150 may penetrate printed circuit substrate 310, escape package 302, and interfere with the operation of other devices. Conversely, EMI originating outside of BGA package 302 may penetrate printed circuit substrate 310 and interfere with the operation of die 150.

Figure 3C:
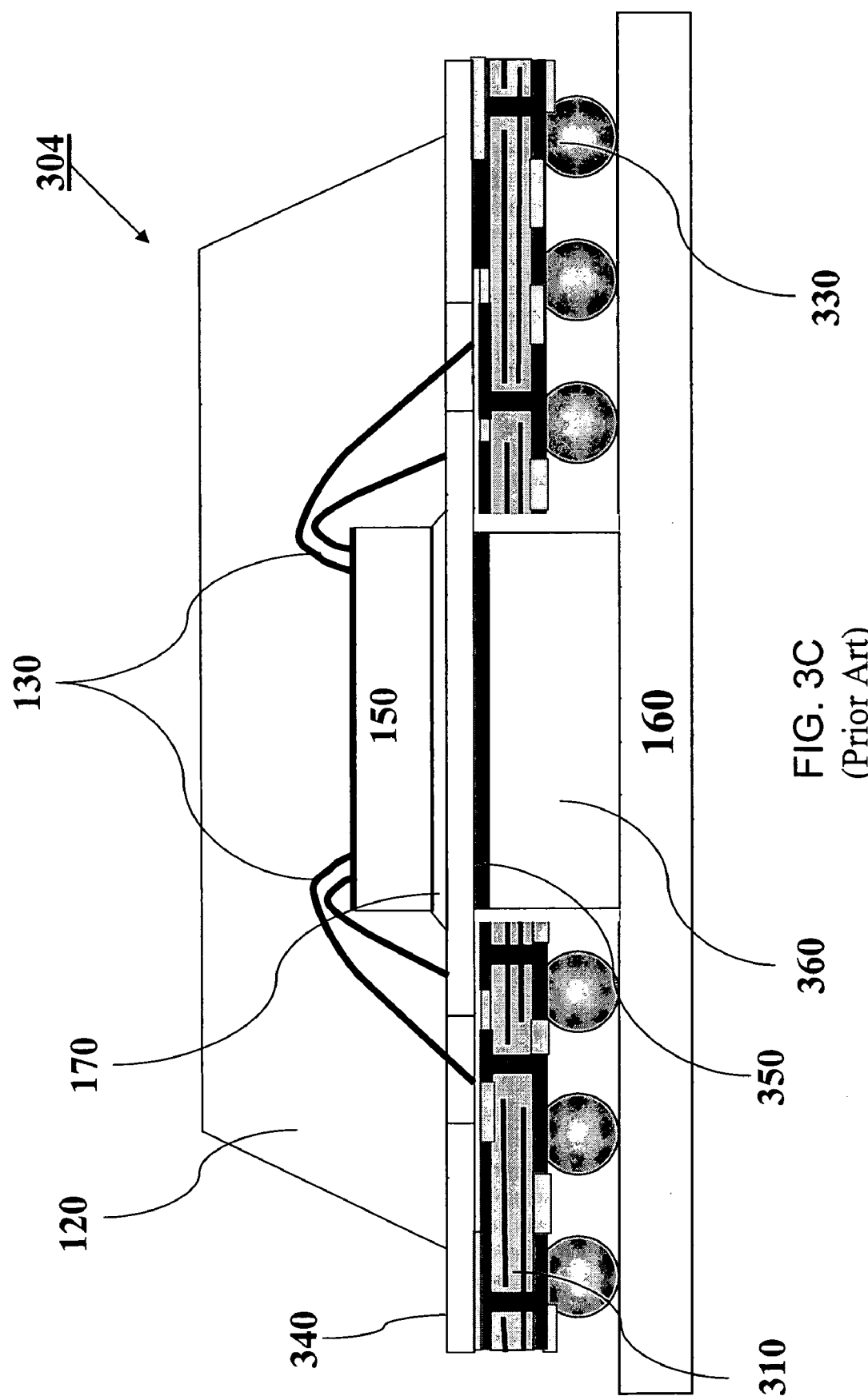

FIG. 3C illustrates a cross-sectional view of a BGA package 304, which provides a thermal and electrical connection between an IC die 150 and PCB 160 through a heat slug 360. For further detail on a package similar to package 304, see U.S. Patent Pub. No. 20030057550-A1, entitled "Ball Grid Array Package Enhanced with a Thermal and Electrical Connector", which is herein incorporated by reference in its entirety. IC die 150 is directly attached to a top surface of a stiffener 340. A heat slug 360 is attached to a bottom surface of stiffener 340 and has a surface that is configured to be mounted to PCB 160. BGA package 304 promotes heat dissipation from IC die 150 to PCB 160, on which BGA package 304 is mounted. Heat slug 360 acts as a thermal and electric connection for heat and current flow from metal stiffener 340 to PCB 160. Stiffener 340 and heat slug 360 can both be metal. Stiffener 340 can be connected to the ground pad on die 150 through a wirebond 130. Although the grounded metal stiffener 340 could prevent penetration of some EMI, the entire top surface of die 150 is exposed to EMI from above.

Figure 3D:
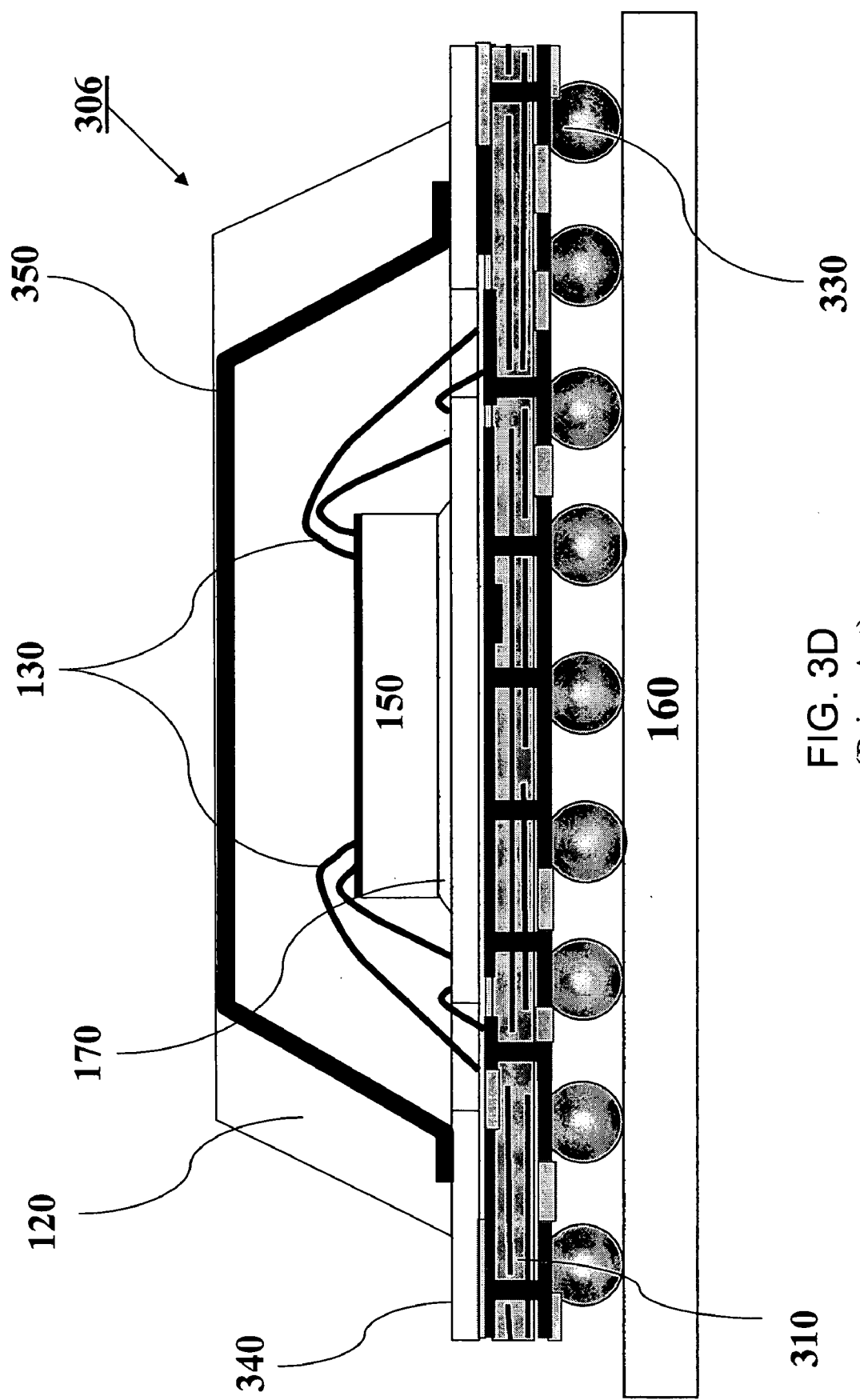

FIG. 3D shows a cross-sectional view of a BGA package 306, which incorporates a metal stiffener 340 and a metal cap 350. For further detail on a package similar to package 306, refer to U.S. App. Publ. No. 20050280127, titled "Apparatus And Method For Thermal And Electromagnetic Interference (EMI) Shielding Enhancement In Die-Up Array Packages," filed Apr. 23, 2004, which is herein incorporated by reference in its entirety. A die 150 is located inside of an enclosure formed by metal stiffener 340 and metal cap 350. Metal stiffener 340 is coupled (e.g., electrically, thermally, and/or structurally connected) to metal cap 350 to provide improved EMI shielding, thermal performance, and environmental protection.

Figure 4A:
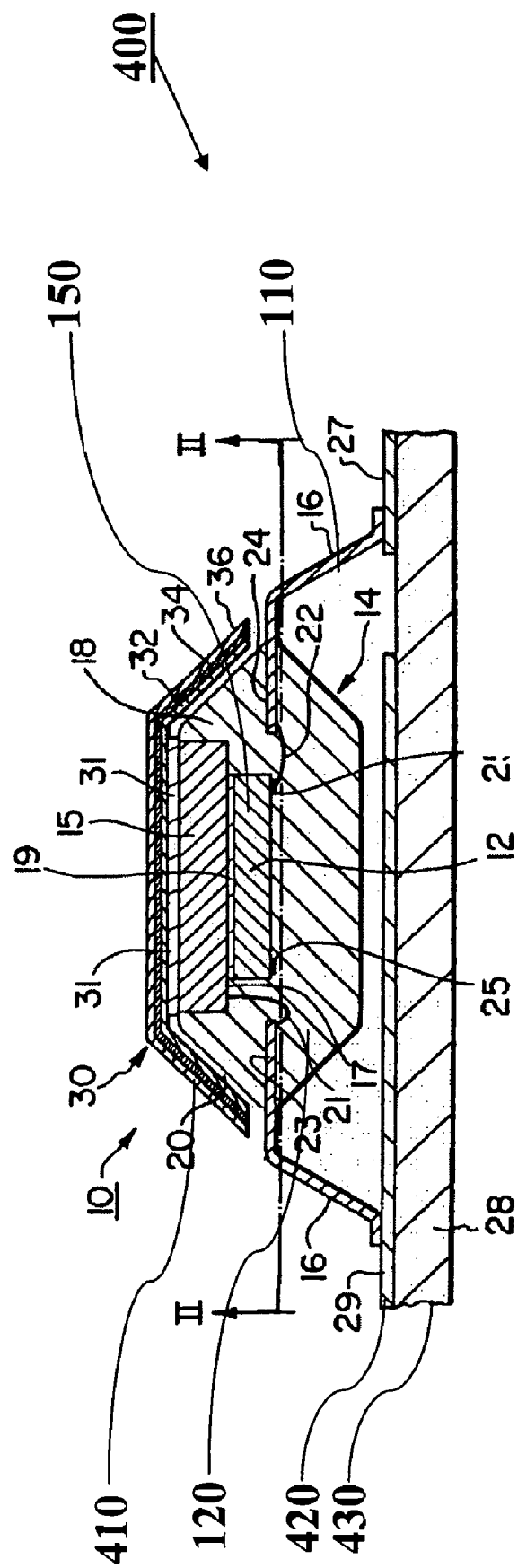
FIGS. 4A-4B illustrate example leadframe IC packages.

FIG. 4A illustrates a "leadframe"-type package 400. For further detail on a package similar to package 400, refer to U.S. Pat. No. 5,294,826, titled "Integrated Circuit Package and Assembly Thereof for Thermal and EMI Management," which is incorporated herein by reference in its entirety. A metal shield 410 is integrated into a die-down leadframe package 400. A top portion of leadframe package 400 is covered with an electrically grounded laminated metal shield 410. However, EMI can enter or exit through a bottom of the leadframe package 400, and a ground plane 420 is required on the PCB 430. A sufficiently sized gap between ground plane 420 and metal shield 410 may permit EMI to enter and exit leadframe package 400.

Figure 4B:
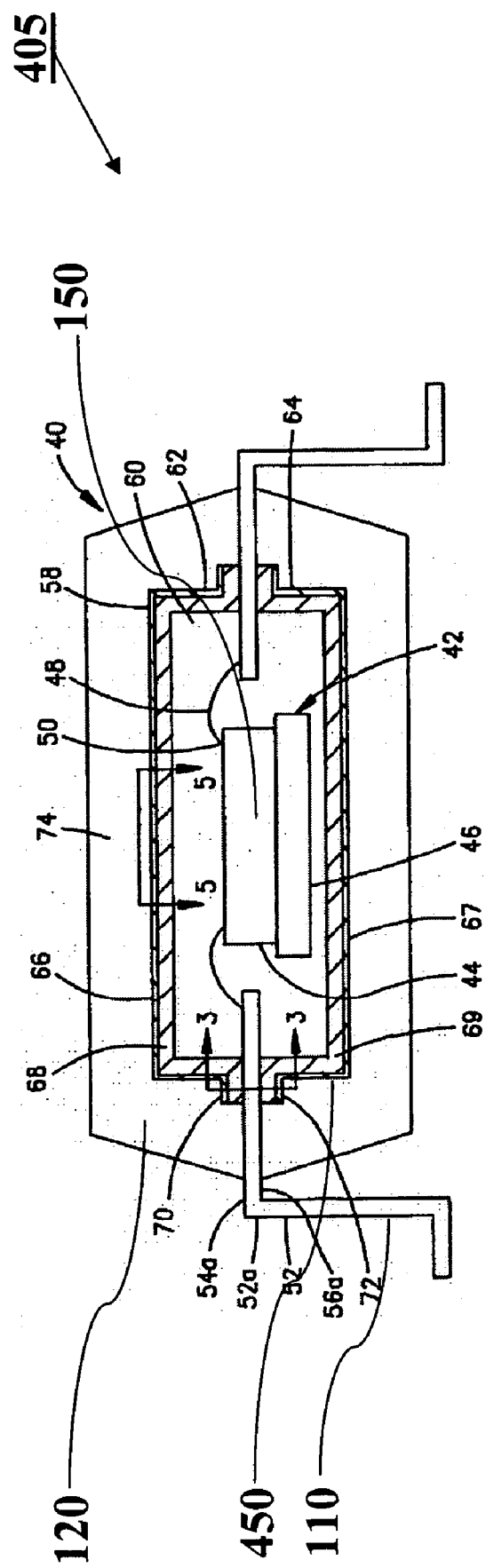

FIG. 4B illustrates a leadframe package 405. For further detail on a package similar to package 405, refer to U.S. Pat. No. 5,650,659, titled "Semiconductor Component Package Assembly Including an Integral RF/EMI Shield," which is incorporated herein in its entirety. Package 405 incorporates a shield box 450 within leadframe package 402, completely encapsulated by encapsulating material 120. IC die 150 is mounted inside shield box 450. Shield box 450 is attached to leadframe 110 and electrically grounded. Shield box 450 has a dielectric inner layer and an electrically conductive outer layer of metallic foil. Package 405 suffers from the same thermal deficiencies as prior leadframe packages, such as package 100 shown in FIG. 1.

Example Cap Structures

According to embodiments of the invention, a first cap and a second cap are incorporated in an IC package. Example structures for the first and second caps are described in this section. These structures are described for illustrative purposes, and are not intended to be limiting. Furthermore, the caps may have sizes and/or proportions other than those described herein. Still further, elements of the cap structures described herein can be combined in any manner.

Figure 5A:
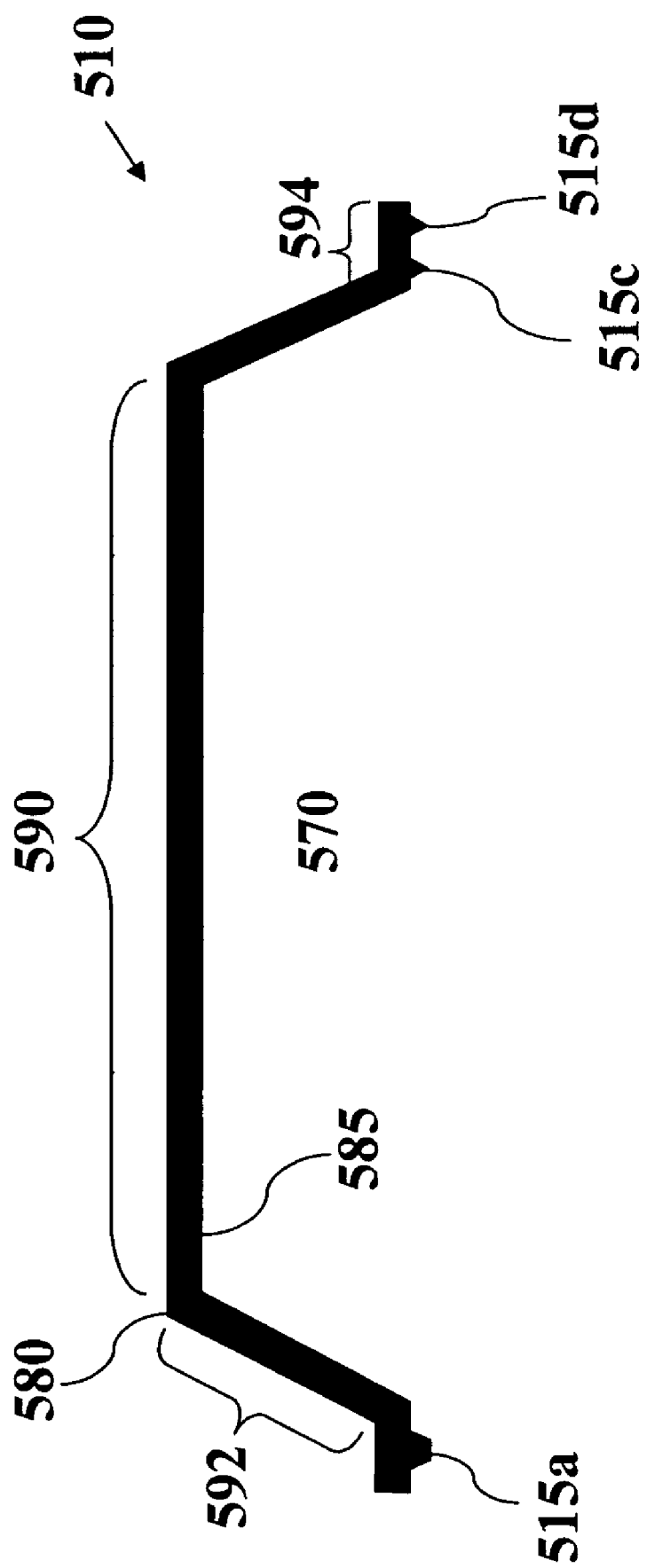
FIGS. 5A-5E show examples of heat spreader caps (caps) according to embodiments of the invention.
Figure 5B:
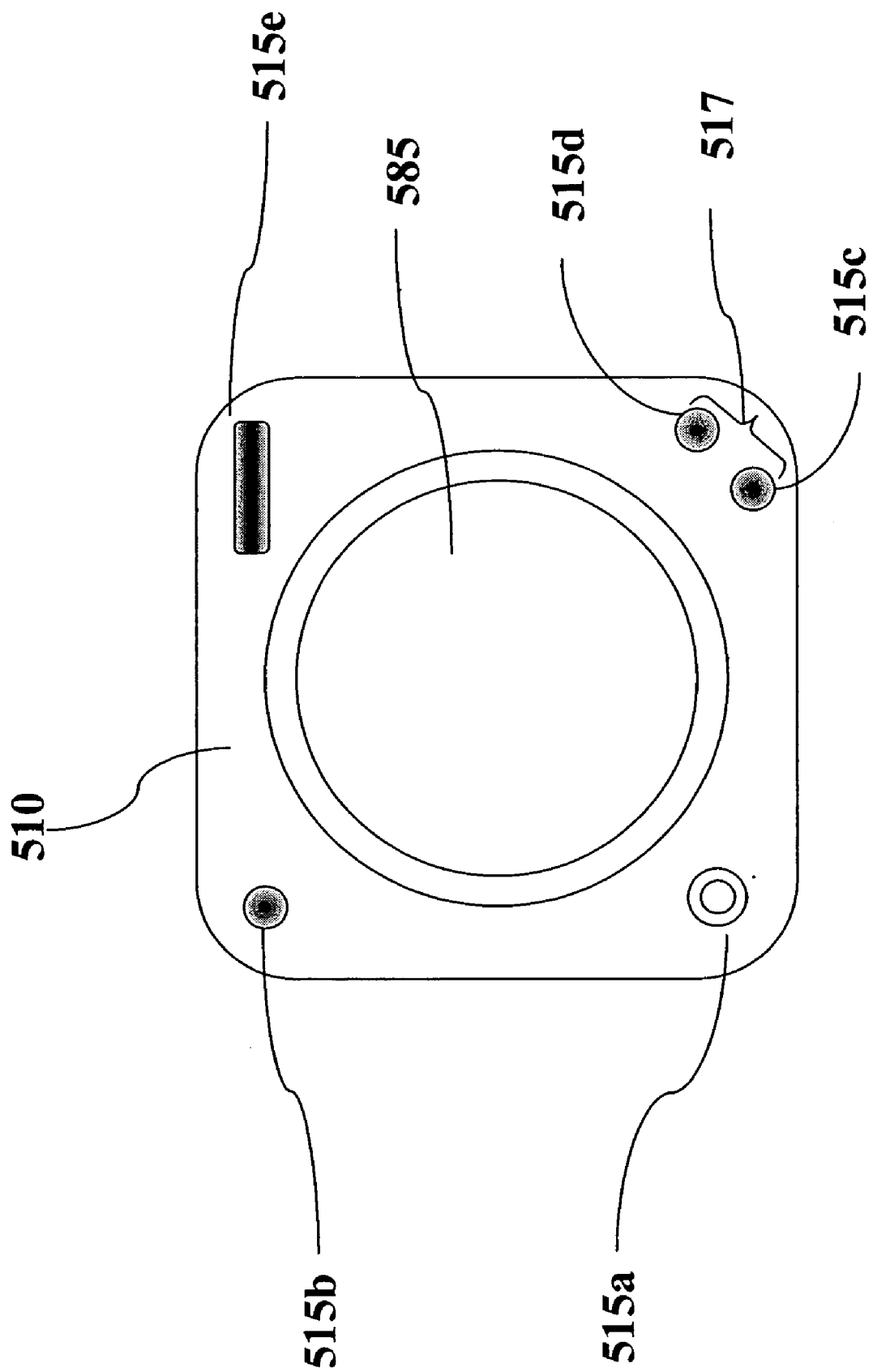
Figure 6A:
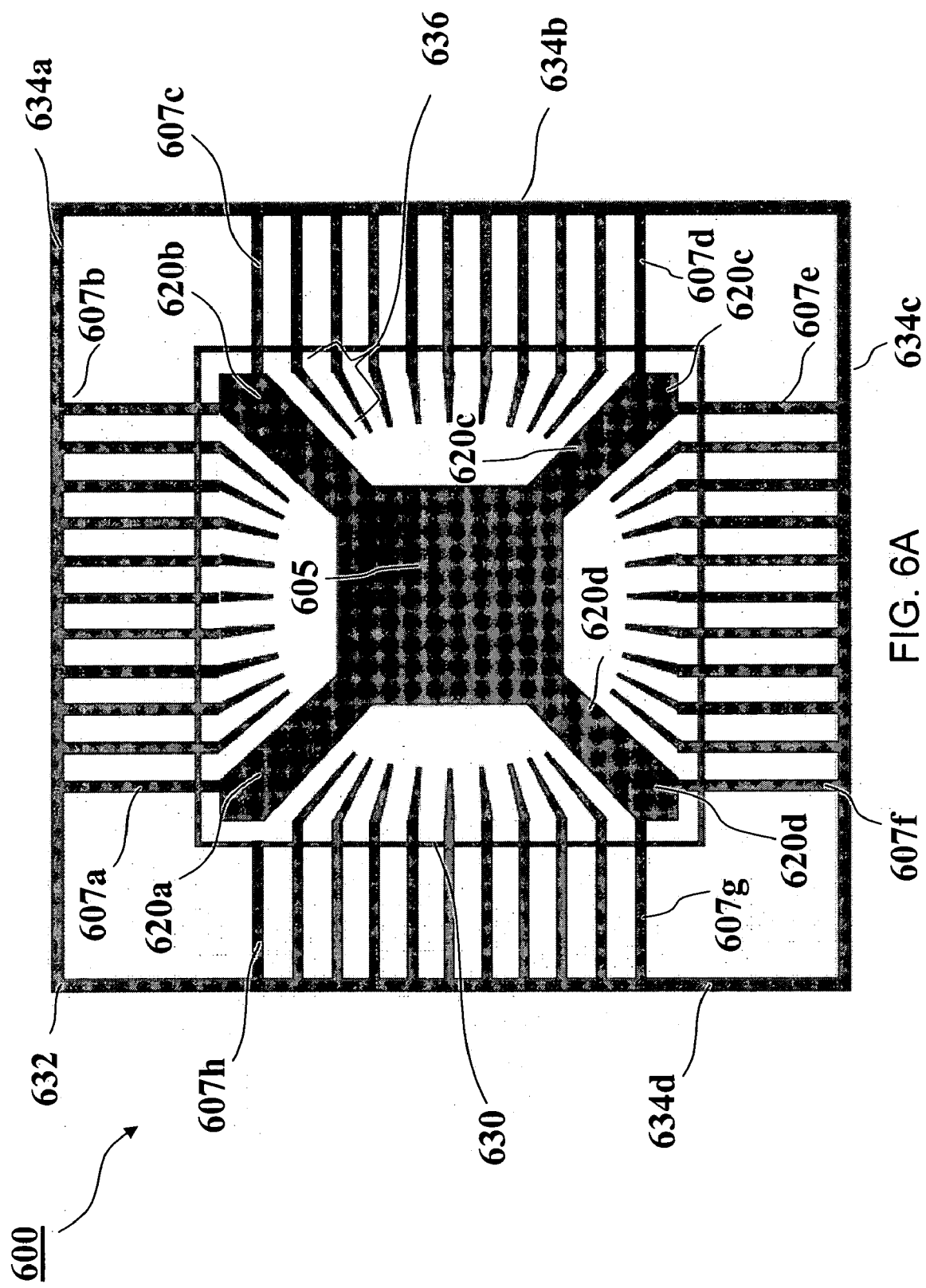
FIGS. 6A-6C show plan views of examples of leadframes according to embodiments of the invention.
Figure 6B:
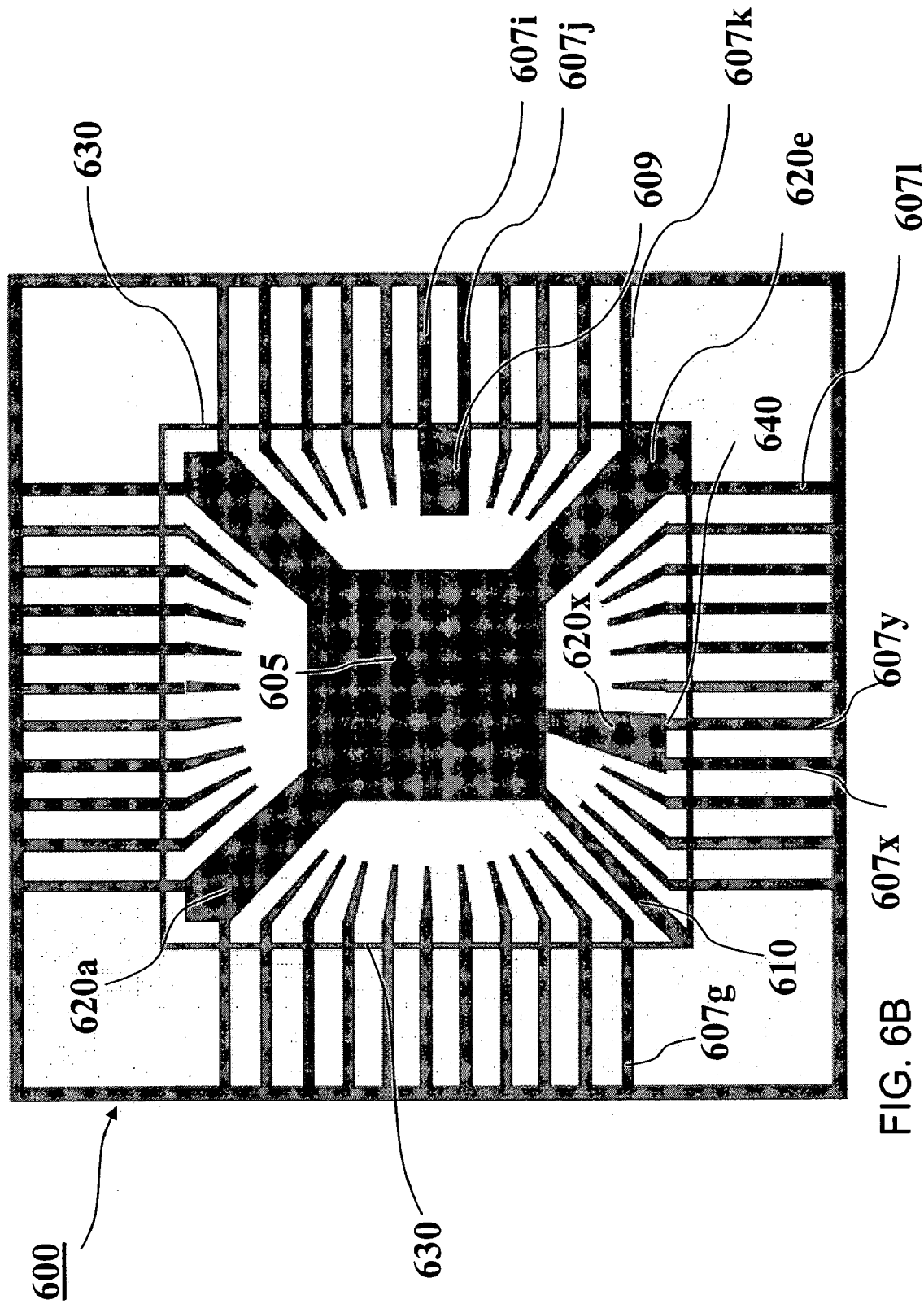
Figure 6C:
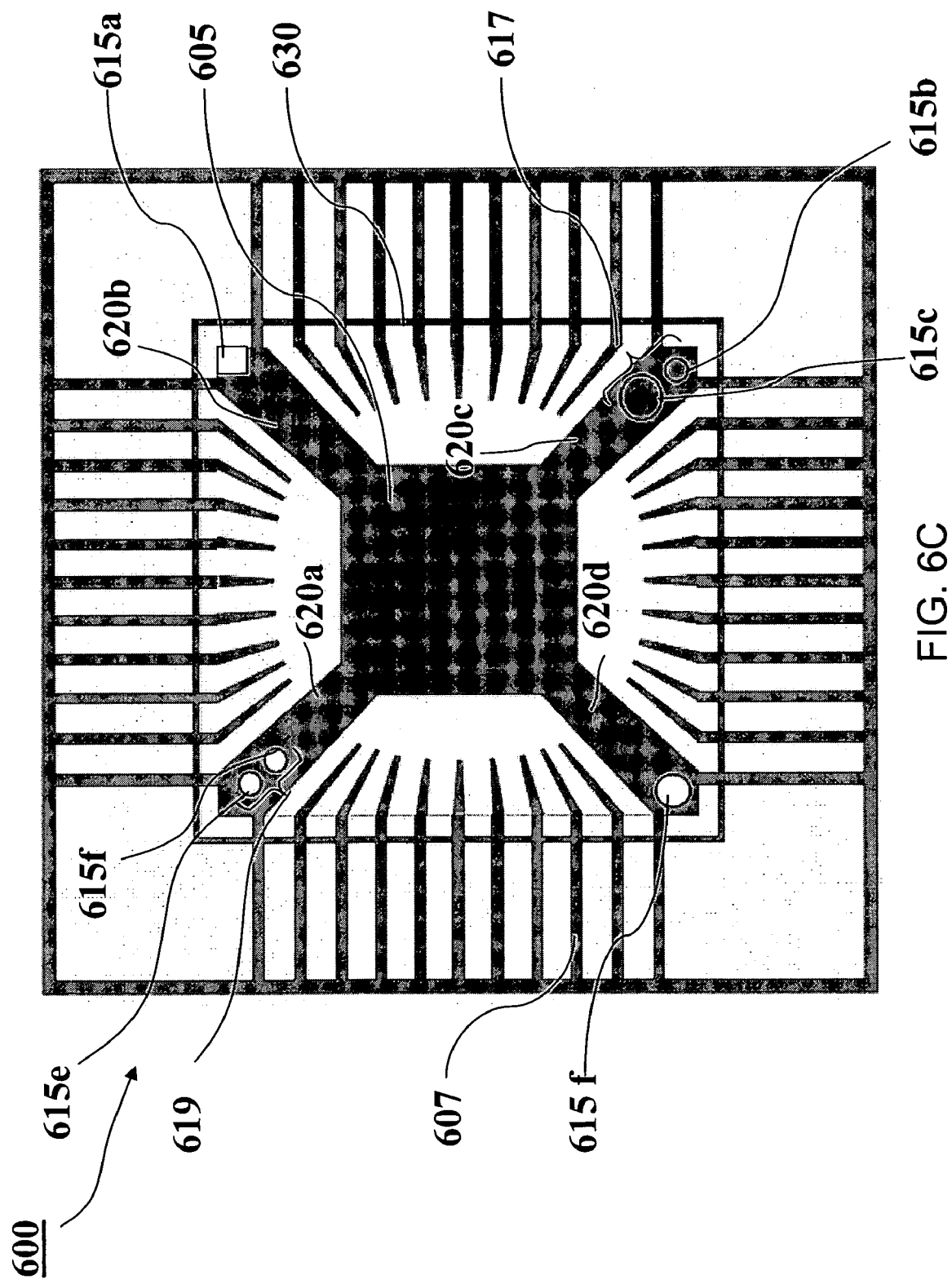

FIG. 5A illustrates a cross sectional view of a cap 510. FIG. 5B illustrates a bottom view of cap 510 in accordance with an embodiment of the present invention. Cap 510 is an example of the first and second caps that may be incorporated into IC packages. Caps 510 may be incorporated into various integrated circuit packages, such as shown in FIGS. 7A-7I, which are described in detail below. The packages may incorporate leadframes, such as shown in FIGS. 6A-6C, which are described in detail below.

In an embodiment, cap 510 has a top portion 590, sidewall portion 592, and a rim 594 extending around a bottom periphery of the cap 510. Sidewall portion 592 couples (e.g., electrically, structurally, and thermally) top portion 590 to rim 594. Further, sidewall portion 592 is angled outward from top portion 590. Although FIG. 5A illustrates a planar top portion 590, top portion 590 can be non-planar (e.g., curved, concave, convex, hemispherical, or other shapes). Although FIGS. 5A and 5B illustrate an angled-outward sidewall portion 592, sidewall portion 592 may be perpendicular to or angled inward from top portion 590. Furthermore, sidewall portion 592 is not limited to a linear cross-section and may employ other cross-sectional shapes such as convex inward and outward as would be understood by one skilled in the art.

Cap 510 further has a first surface 580 and a second surface 585. Second surface 585 forms an upper surface of a cavity 570 in a bottom portion of cap 510. Rim 594 surrounds cavity 570. Cavity 570 is shown in FIG. 5A as having a trapezoidal cross section, but may have other shapes (e.g., square, rectangular, irregular, etc.). Although FIG. 5B illustrates second surface 585 having a circular shape, second surface 585 may have other shapes. Further, cap 510 may have various shapes such as round, rectangular, square, elliptical, oval, or any other shape.

In cap 510, a bottom surface of rim 594 has one or more protruding tabs 515a-e. Tabs 515a-e may have any shape. For example, FIGS. 5A and 5B show a frustum tab 515a, a conical tab 515b, a pair 517 of conical tabs 515c and 515d, and an oblong shaped tab 515e. Cap 510 is not limited to the shapes, sizes, locations, or numbers of tabs 515 shown. Cap 510 may also have zero or more tabs of any shape, of any size, in any locations.

When incorporated in an IC package having a leadframe, the outer periphery dimension of cap 510 is preferably the same size as the periphery (e.g., see FIG. 7C) or smaller than the periphery (see FIG. 7A) of the leadframe's "shoulder bends" to facilitate visual inspection of lead interconnect on the circuit board. In an alternative embodiment, the outer periphery dimension of cap 510 extends beyond the periphery of the leadframe's "shoulder bends" leading to a gap 788 as shown in FIG. 7C. For manufacturing considerations, the outer periphery of cap 510 is preferably smaller than the dimension of the leadframe inner support ring support ring 630 (e.g., see FIGS. 6A and 8C, further described below). Inner support ring 630 is also called a dam bar. Although cap 510 is illustrated as having a particular size, other sizes may be used, as would be understood by persons skilled in the relevant art(s).

In an embodiment, cap 510 may be configured to mount an external heat sink (e.g., see FIG. 7F, further described below). In another embodiment, cap 510 may be configured to be thermally and/or electrically connected to a circuit board (e.g., see FIGS. 7G and 7H, further described below). The circuit board can be any type of circuit board such as a printed circuit board (PCB), a printed wire board (PVVB), etc. as would be understood by someone skilled in the art.

Cap 510 may be made of a thermally conductive material and/or an electrically conductive material, such as a metal. For example, the material for cap 510 may include copper, a copper alloy, (e.g., C194, C151, C7025, or EFTEC/64T), aluminum, an aluminum alloy, ferromagnetic materials, laminated copper or iron, etc. Other metals and combinations of metals/alloys, or other thermally and electrically conductive materials (e.g., ceramics, metallized plastics, laminated metal foils on plastic or ceramic, etc.) may be used. Cap 510 and the leadframe may be made of the same material or different materials. When cap 510 and the leadframe are made of the same material, or materials having the same coefficient of thermal expansion, structural integrity may be improved, such as reducing thermal stress on the die (sandwiched between the cap and the leadframe). Furthermore, cap 510 may have any thickness, depending on the particular application. For example, cap 510 may have a thickness of 0.1 to 0.5 mm. Alternatively, cap 510 may have a thickness of less than 1.0 mm.

In an embodiment, the bottom surfaces or portions of the bottom surface of rim 594 may be coated or laminated with a layer of dielectric material (e.g. solder mask, dielectric film etc.). In this manner, the shorting of leads after package assembly may be prevented.

Figure 5C:
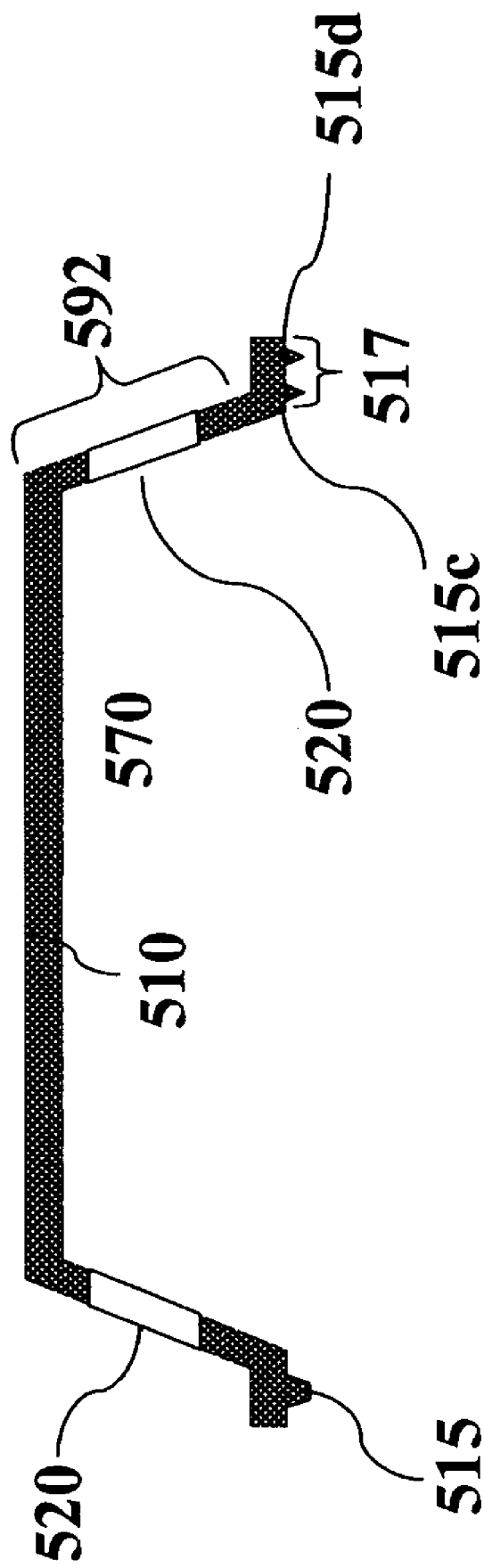
Figure 5D:
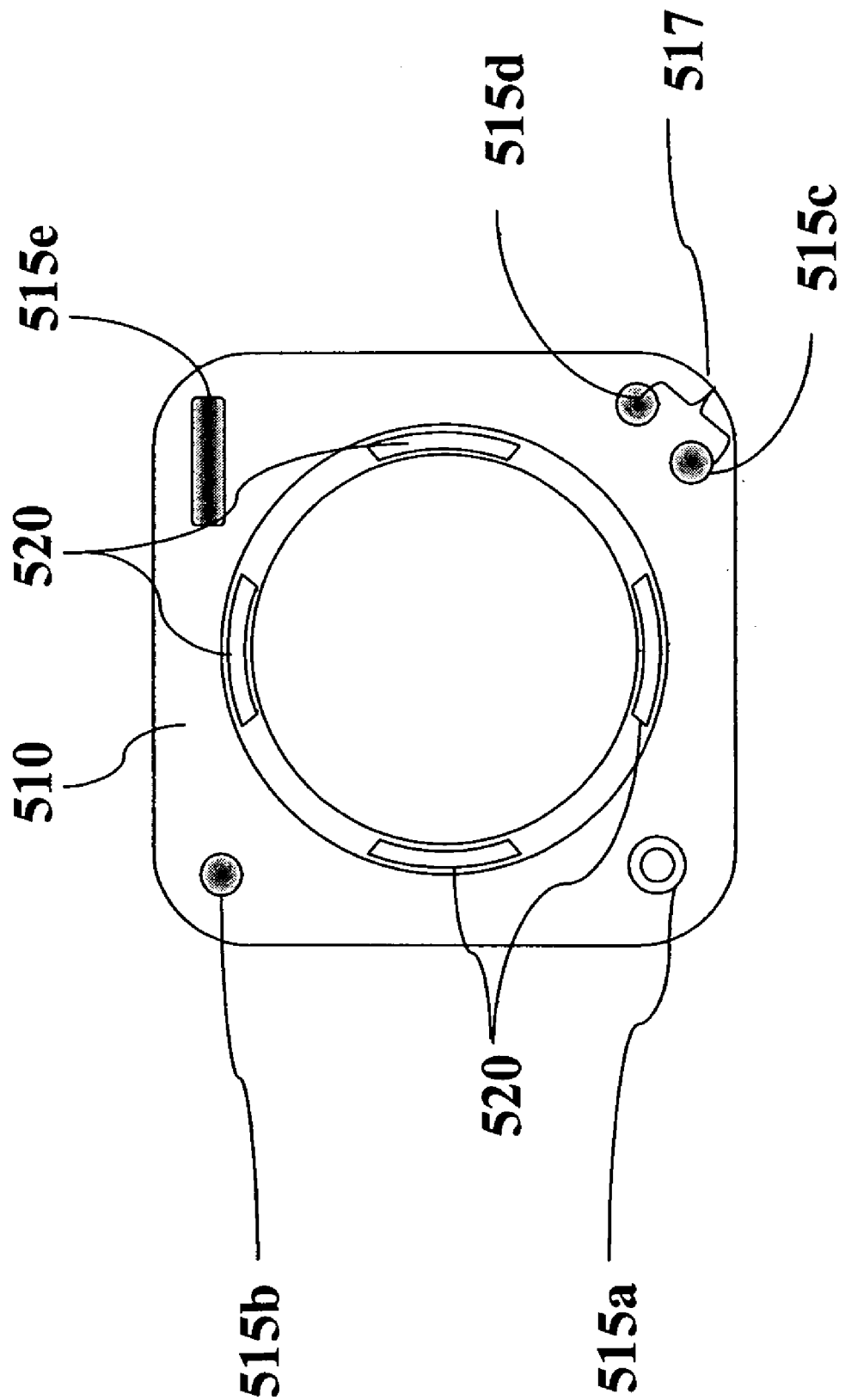

Furthermore, in an embodiment, cap 510 may have openings through the first surface 580 and the second surface 585. For example, FIGS. 5C and 5D show example caps 510 having openings or slots 520 formed in sidewall portions 592, according to embodiments of the present invention. Although FIGS. 5C and 5D illustrate slots 520 in sidewall portion 592 as rectangular or trapezoidal, slots 520 can have other shapes.

Figure 5E:
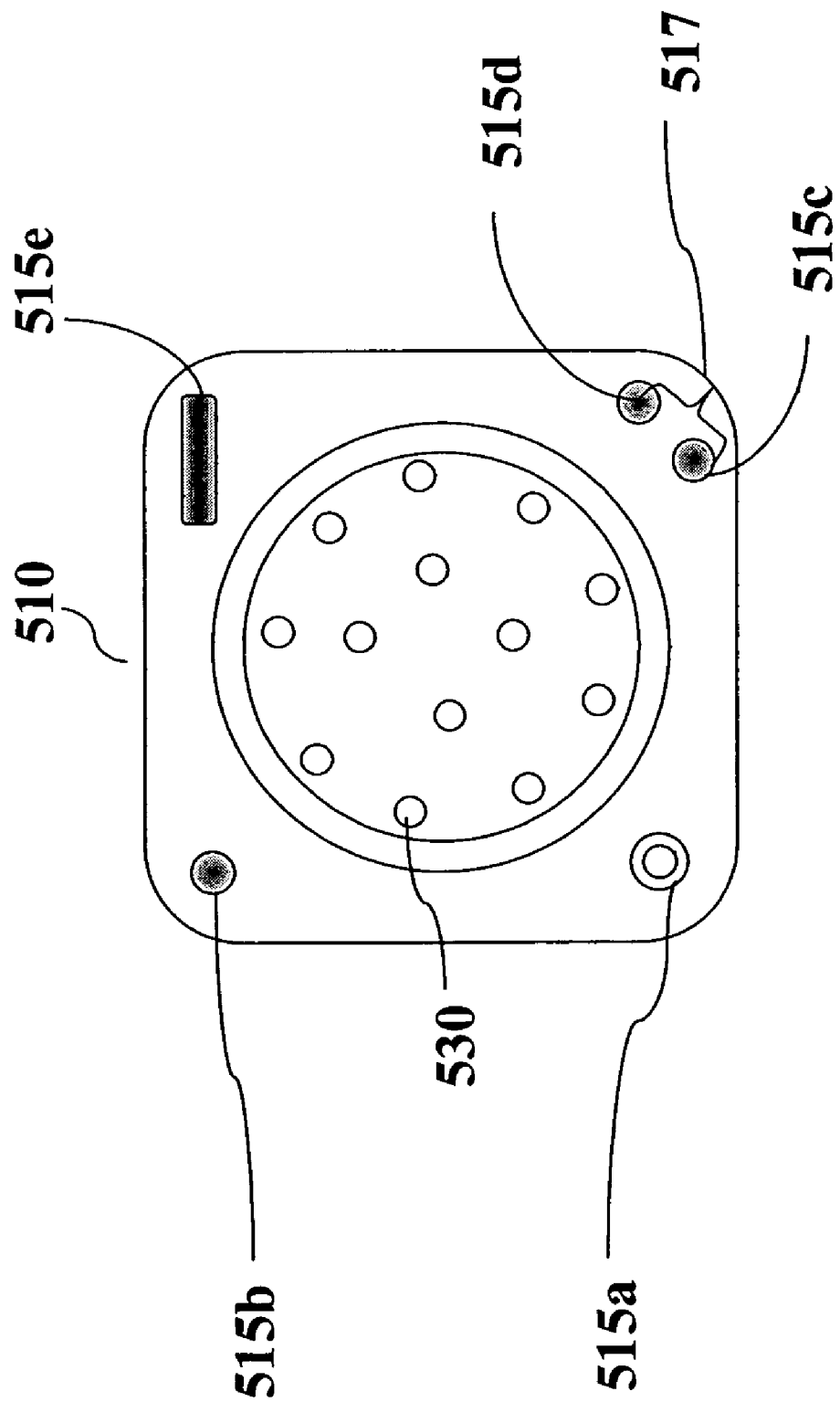

Furthermore, cap 510 may have holes/openings 530 in top portion 590 as illustrated in FIG. 5E, according to an example embodiment of the present invention. Cap 510 may have any number of holes. Furthermore, holes 530 can have any shape.

In cap 510, holes 530 and slots 520 allow the flow of encapsulating material 120 into cavity 570 during a manufacturing process. Additionally or alternatively, slots 520 and holes 530 may release pressure buildup (during or after manufacture) occurring in cavity 570. Because smaller holes 530 and slots 520 may require a higher pressure to flow or inject encapsulating material 120 into cavity 570, larger holes 530 and slots 520 may be desirable from a manufacturing perspective. However, in an embodiment, cap 510 may require the size of holes 530 and slots 520 to be limited to reduce EMI penetration. In an embodiment, a hole 530 or slot 520 diameter is in the range of 0.5-3.0 mm. In an embodiment, a diameter 1.5 mm may be used to shield against EMI having a highest harmonic frequency of about 10 GHz. An outer surface of cap 510 may be completely or partially encapsulated in encapsulating material 120, or may have no encapsulating material 120 covering it.

Example Leadframe Structures

Example embodiments for leadframe structures are described in this section. Further embodiments will become apparent to persons having skill in the relevant art(s) from the teachings herein. Elements of the leadframe embodiments described herein can be combined in any manner in leadframes.

FIGS. 6A-6C illustrate various leadframe structures, according to example embodiments of the present invention. FIG. 6A shows a leadframe 600 having a die attach pad (DAP) 605, a plurality of leads 607, a plurality of tie bars 620, an inner support ring 630, and a perimeter support ring 632. In FIG. 6A, leadframe 600 is rectangular in shape, having a rectangular perimeter support ring 632 surrounding its periphery. Perimeter support ring 632 includes a first perimeter edge 634a, a second perimeter edge 634b, a third perimeter edge 634c, and a fourth perimeter edge 634d, coupled in a rectangular ring. DAP 605 is centered in leadframe 600. DAP 605 is rectangular in shape. In the embodiment of FIG. 6A, tie-bars 620 extend outward from the four corners of DAP 605.

Leads 607 extend inward perpendicularly from perimeter support ring 632. Leads 607 are also coupled to inner support ring 630, which forms a rectangular shape surrounding DAP 605. Leads 607a-h, located adjacent to corners of perimeter support ring 632, are coupled to tie bars 620. Lead 607a is coupled between edge 634a of lead frame 600 and tie bar 620a. Lead 607b is coupled between edge 634a of lead frame 600 and tie bar 620b. Lead 607c is coupled between edge 634b of lead frame 600 and tie bar 620b. Lead 607d is coupled between edge 634b of lead frame 600 and tie bar 620c. Lead 607e is coupled between edge 634c of lead frame 600 and tie bar 620c. Lead 607f is coupled between edge 634c of lead frame 600 and tie bar 620d. Lead 607g is coupled between edge 634d of lead frame 600 and tie bar 620d. Lead 607h is coupled between edge 634d of lead frame 600 and inner support ring 630.

Leads 607 are supported by perimeter support ring 632 and inner support ring 630 in lead frame 600. Leads 607 (except leads 607a-h) each include an inner lead portion 636 within inner support ring 630 that are generally oriented radially with respect to a center leadframe 600.

Although FIGS. 6A-6C illustrate a rectangular (e.g., square) leadframe 600, DAP 605, and inner support ring 630, other shapes could also be employed (e.g., circle, ellipse, curvilinear rectangle, etc). Furthermore, the number of leads 607 is not limited by FIG. 6A, and in embodiment, leadframes may have any number of leads 607.

Tie bars 620a-620d are stripe-shaped portions of leadframe 600 that are coupled between respective corners of DAP 605, and end in one or more of leads 607a-g of a respective corner of a leadframe 600. Tie bars 620a-620d may each have a uniform or non-uniform width (e.g., a gradually increasing width). In alternate embodiments, tie bar may extend to inner support ring 630 and not couple to any leads. For example, FIG. 6B shows tie bar 610 coupled to inner support ring 630 and not coupled to any leads. Moreover, a tie bar may extend to the inner support ring and also couple to one or more leads. For example, in FIG. 6B tie bar 620e extends to inner support ring 630 and is coupled to leads 607k and 607l. Further, a tie-bar may be widened. For example, FIG. 6B shows a tie bar 620e that is widened (i.e., is wider than another tie bar, tie bar 610). Moreover, there also may be one or more fused leads in which one or more leads are fused to DAP 605. For example, FIG. 6B shows leads 607x and 607y having ends that are fused to DAP 605 to form fused lead 620x, this also effectively electrically couples leads 607x and 607y. In alternate embodiments, any number of leads can form a fused lead. One or more leads may also be fused to other leads. FIG. 6B also shows a lead 609, where a lead 607i is fused to a second lead 607j in a side-by-side fashion. Fused lead 609 is wider than others of leads 607. Any number of leads may be fused together in this manner.

Alternatively, leadframe 600 may have no widened fused leads nor fused tie bar leads 620x. Furthermore, as shown in FIG. 6B, lead frame 600 may have one or more tie bars 610 that are not coupled to leads 607. As shown in FIG. 6B, a first end of tie bar 610 is coupled to a corner of DAP 605, and a second end of tie bar 610 extends radially from DAP 605, and is not coupled to a lead 607.

In an embodiment illustrated in FIG. 6C, tie-bars 620a-d have receptacles 615 formed therein. Receptacles 615 correspond to tabs 515 formed in a cap 510. As with tabs 515, receptacles 615 can include a rectangular shaped receptacle 615a, a pair 617 of conical shaped receptacles 615b and 615c, a pair 619 of rounded receptacles 615d and 615e, and a rounded receptacle 615f. However, receptacles 615 are not limited to these shapes, combinations of shapes, numbers, locations, or sizes. Receptacles 615 may be indentions (not fully penetrating the leadframe 600) or may be cut-outs (fully penetrating the leadframe 600). Leadframe 600 may have any number of receptacles 615 of any size, shape, and in locations. Receptacles 615 on leadframe 600 are configured to couple with tabs 515 on a cap 510 providing increased structural strength, as well as enhanced thermal and electrical connection.

Furthermore, after or prior to integration into an IC package, inner support ring 630 and perimeter support ring 630 and perimeter support ring 632 are removed from leadframe 600. Thus leads 607 are no longer electrically coupled by support rings 630 and 632.

Example materials for leadframe 600 include metals, such as copper, copper alloy, (e.g., C194, C151, C7025, or EFTEC/ 64T), aluminum, aluminum alloys, ferromagnetic materials, other metals and combinations of metals/alloys, or other thermally and electrically conductive materials. Cap 510 and leadframe 600 may be made of the same material or different materials. Leadframe 600 may be any thickness depending on the particular application. For example, leadframe 600 thickness may range from 0.05 mm to 0.5 mm. In another embodiment, leadframe 600 is less than 1.17 mm thick.

In an embodiment, leadframe 600 provides for electrical connections between a die and a circuit board substrate (e.g. via leads 607). Furthermore, in another embodiment, leadframe 600 provides stiffening and/or structural support to an IC package. In another embodiment, leadframe 600 provides heat spreading to an IC package. In another embodiment, leadframe 600 is electrically conductive, and can act as a power or ground plane for an IC package. In embodiments, leadframe 600 can be configured to provide any combination of stiffening, heat spreading, and electrical conductivity, as required by the particular application.

Example Leadframe/Cap Enclosure Structure

Example embodiments for IC packages are described in this section. Further embodiments will become apparent to persons having skill in the relevant art(s) from the teachings herein. Elements of the IC package embodiments described herein can be combined in any manner.

Figure 7A:
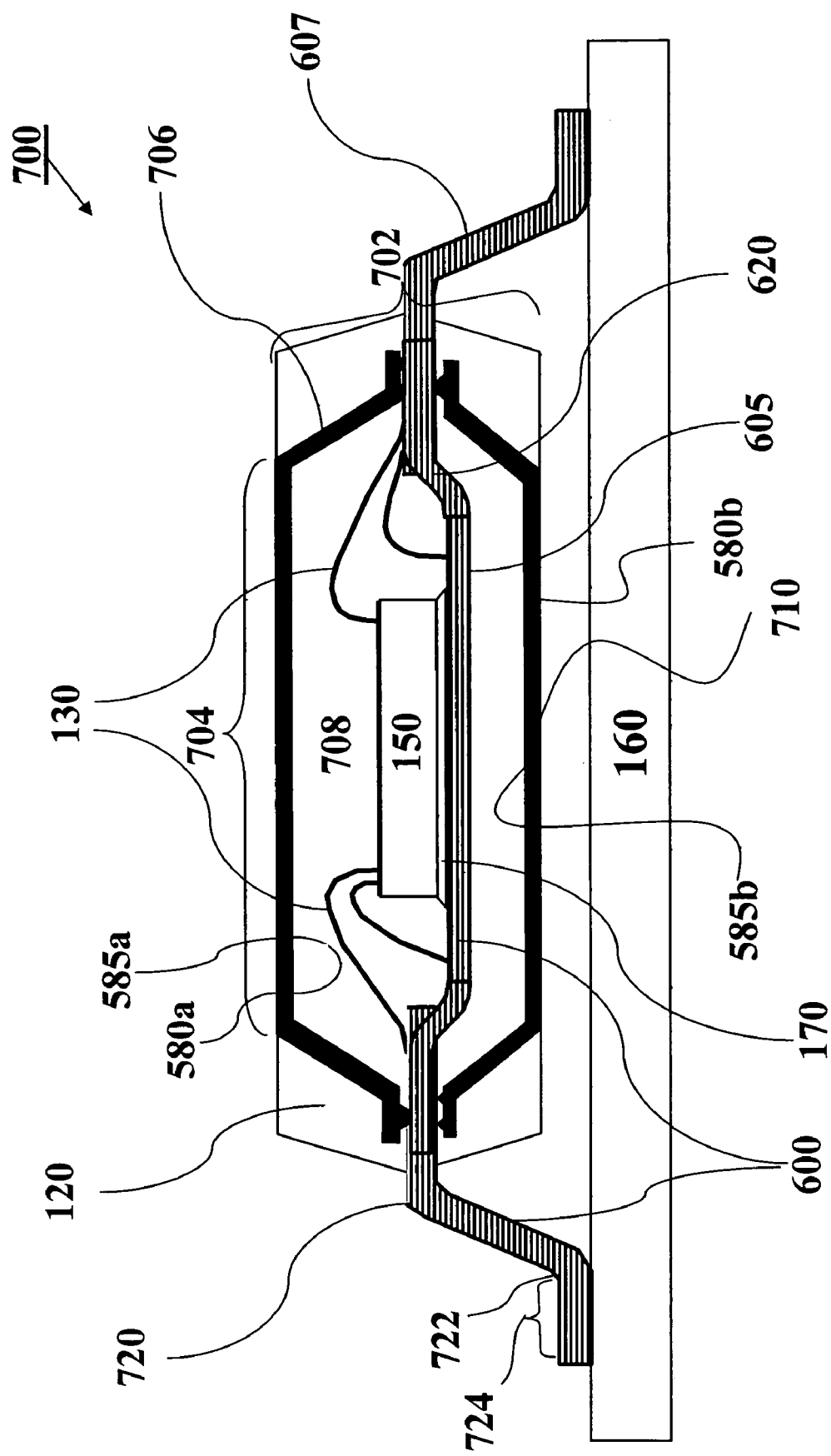
FIGS. 7A-7M show cross-sectional views of examples of leadframe IC packages, according to embodiments of the invention.

FIG. 7A shows an example IC package 700, according to an embodiment of the invention. As shown in FIG. 7A, a first cap 706 and a second cap 710 are coupled to leadframe 600. First and second caps 706 and 710 may be configured in any manner as described for cap 510 above, and in other manners. As illustrated in FIG. 7A, a die 150 is mounted on the same side of DAP 605 as first cap 706. First cap 706 is mounted to a top surface of leadframe 600, such that die 150 resides in or below cavity 570 of first cap 706. Second cap 710 is mounted to a bottom surface of leadframe 600 in an opposing configuration with respect to first cap 706. Leadframe 600 and first cap 706 and 710 form an enclosure structure 702 that substantially encloses die 150, providing improved structural integrity, EMI shielding, thermal performance, and environmental (e.g., mechanical shock, vibration, caustic, moisture, and radiation) protection. A cavity 708 is formed within enclosure structure 702. Note that in embodiments, additional dies and/or other electrical components can be attached to DAP 605.

In an embodiment, first and second caps 706 and 710 and leadframe 600 are made of copper or copper alloys. The thermal conductivity of copper (roughly 390 W/m·K) is much greater than for typical encapsulating materials 120 (0.2-0.9 W/m·K). Therefore, the heat generated by die 150 is conducted through adhesive 170 to DAP 605 and out of the package through leads 607 and first and second caps 706 and 710. Also, because first and second caps 706 and 710 and leadframe 600 are electrically connected in the embodiment of FIG. 7A, they may form a near-equipotential surface, such that enclosure structure 702 approximates an ideal Faraday Cage. In this manner, die 150 is isolated from external EMI. Additionally, external devices are also shielded from EMI generated by die 150. Since copper and copper alloys have a much higher modulus of elasticity (about 125 GPa) compared to a typical cured plastic molding compound used for encapsulating material 120 (about 25 GPa), copper embodiments of the present invention provide improved structural rigidity and environmental protection.

In an embodiment, first and second caps 706 and 710 are coupled to leadframe 600 without the use of tabs and receptacles. In another embodiment, as shown in FIG. 7A, first and second caps 706 and 710 have tabs 515 which fit corresponding receptacles 615. Tabs 515 and corresponding receptacles 615 may facilitate tight lock-in of first and second caps 706 and 710 to leadframe 600. Further, the configuration of tabs 515 and receptacles 615 are such that first and second caps 706 and 710 will mate correctly with leadframe 600 in only one orientation, which may facilitate assembly. Note that in an alternative embodiment, first and second caps 706 and 710 may have receptacles that interlock with tabs of leadframe 600.

Thermally and/or electrically conductive adhesive materials (e.g., epoxy filled with metal or other conductive flakes, solder, etc.) may be used to improve the coupling between first and second caps 706 and 710 and leadframe 600. An adhesive material can be used to attach a tab 515 and a receptacle 615, when they are present. Alternatively, the adhesive material may be used at areas where first and second caps 706 and 710 contact leadframe 600.

Leadframe 600 may be plated with a conductive material to improve thermal and electrical connection with first and/or second caps 706 and 710. In an embodiment, first and second caps 706 and 710 may be mounted to DAP 605 of leadframe 600. In another embodiment, as shown in FIG. 7A, first and second caps 706 and 710 are mounted to the tie-bars 620 coupled between DAP 605 and leads 607. In yet another embodiment, first and second caps 706 and 710 may be mounted to one or more leads 607. In embodiments, first and second caps 706 and 710 can be mounted to any combination of DAP 605, tie bars 620, and leads 607. Further, portions of the bottom surface, or all of the bottom surface of rim 594 of the first and second caps 706 and 710 may be coated with a layer of dielectric material (e.g. solder mask, dielectric film etc.) to prevent electrical shorting with one or more of leads 607. Still further, first cap 706 and second cap 710 may be differently sized, and thus may be mounted to leadframe 600 differently. For example first cap 706 may be mounted to DAP 605 while second cap 710 is mounted to tie bars 620.

Figure 7B:
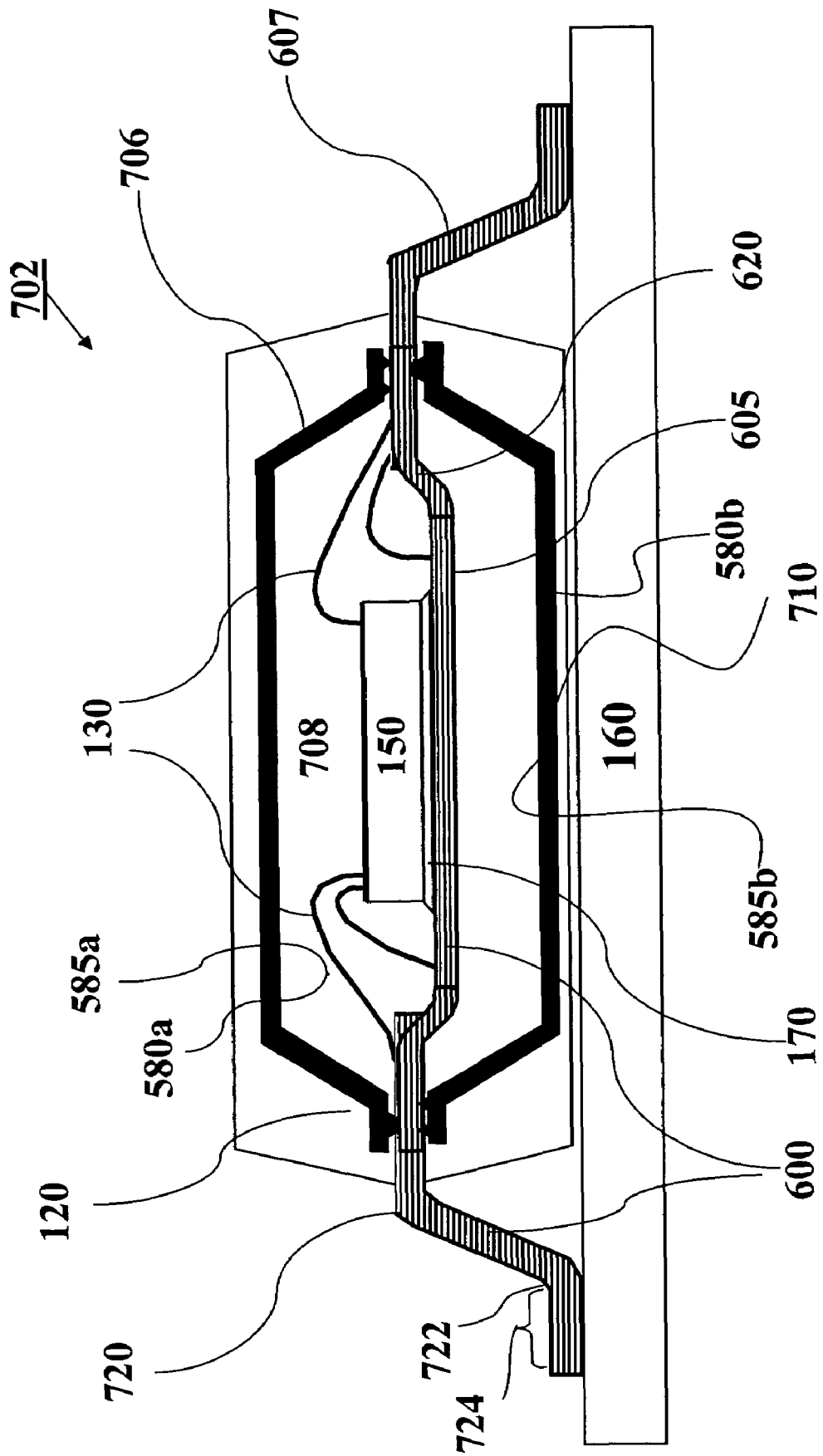
Figure 7C:
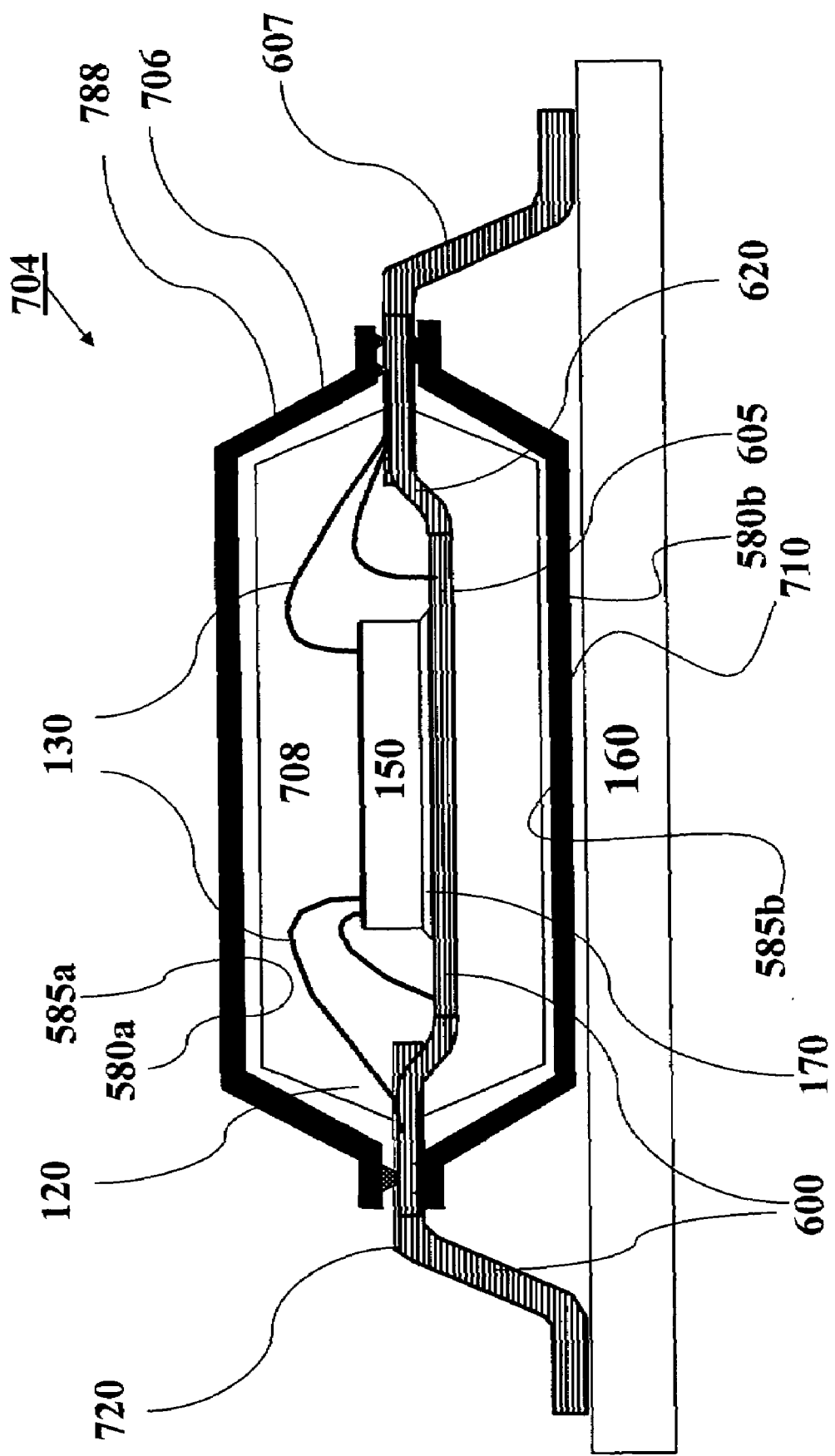

As shown in FIG. 7A, leads 607 of leadframe 600 are shaped to be coupled to a circuit board, where the circuit board could be a PCB, PWB, etc. as understood by someone skilled in the art. For example, as shown in FIG. 7A, an outer portion of leads 607 extending from package 700 may be bent to allow leads 607 to contact a PCB. For instance, leads 607 may be bent to form an "L" or "hockey stick" type shape, having a first bend 720, and a second bend 722. End portion 724 of leads 607 can be coupled to circuit board 160, as shown in FIG. 7A. As shown in FIG. 7A, leads 607 may be bent toward a side of package 700 away from die 150 to form a "die up" package. Alternatively, leads 607 may be bent toward a side of the package toward die 150 to form a "die down" package, (such as shown in FIGS. 7G and 7H).

Further Example Integrated Circuit Packages

Integrating an encapsulating material, such as glob top or plastic molding compound, with an enclosure structure, such as enclosure structure 702, may enhance the structural rigidity and planarity of the IC package. For example, the combination of the encapsulating material and the enclosure structure may reduce IC die cracking and delamination. Integrating the encapsulating material with the enclosure structure also enhances environmental protection. For example, the integrated package can provide protection against mechanical stress, impact, vibration, chemical corrosives, moistures, heat exposure, radiation, etc.

Additionally, attaching the IC die directly to the enclosure structure adds mass to the die support, and helps reduce microphonics. The metal traces of the IC die have electrical resistance, capacitance, and inductance. After IC packaging and assembly of the package on the circuit board, the IC die is under mechanical stress. Vibration, mechanical shock, or sudden change of temperature can cause a change of stress distribution within the IC die, and thus alter a capacitance and resistance such that a voltage vibration or drift is produced. This phenomenon is called microphonics. Attachment of the semiconductor die directly to the enclosure structure increases the mass and helps dampen these mechanical shocks and vibrations, thus reducing microphonics.

Typical encapsulating materials, such as plastic molding compound, have low thermal conductivity (e.g., about 0.2 to 0.9 W/m·K) and therefore create a bottleneck for heat dissipation in conventional IC packages. In an embodiment, the enclosure structure eliminates this bottleneck by providing a thermally conductive path from the bottom surface of the IC die to the outer surfaces of the package. Additionally, the enclosure structure is made with materials that have high thermal conductivity (e.g., approximately 390 W/m·K for copper) and therefore promote heat dissipation.

Enclosure structure 702 formed by first and second caps 706 and 710 and leadframe 600 may be incorporated into IC packages of many different configurations. FIGS. 7A-7I illustrate some example embodiments of the present invention. For example, package 700 of FIG. 7A shows die 150 attached to a DAP 605 with a thermally and/or electrically conductive adhesive 170 (such as an epoxy with metal or other conductive particles or flakes, solder, etc.). As described elsewhere herein, first and second caps 706 and 710 are coupled with leadframe 600 to form an enclosure structure 702 substantially enclosing die 150. Package 700 is encapsulated in encapsulating material 120 (which may be formed in a mold). Package 700 may be mounted to a circuit board 160, including printed wiring boards (PWBs). In package 700, at least one wirebond 130 couples at least one bond pad (not shown) on a surface of IC die 150 to leadframe 600.

Although not shown in FIGS. 7A-7M, a package may include first and second caps 706 and 710 having one or more openings (e.g. slots 520 and/or holes 530) as described elsewhere herein. These openings may act as mold gate openings, allowing encapsulating material 120 to flow or be injected into cavity 708. As shown in FIG. 7A, first cap 706 has a surface 704a and second cap 710 has surface 704b that is exposed through the molding material 120 encapsulating package 700. Thus, encapsulating material 120 does not cover caps 706 and 710 entirely. In FIG. 7A, second surface 585a of cap 706 and second surface 585b of second cap 710 is covered by encapsulating material 120. FIG. 7B illustrates an embodiment where both first surface 580a and second surface 585a of first cap 706 and first and second surfaces 580a and 585b of second cap 710 are covered by encapsulating material 120. FIG. 7C illustrates an embodiment where first and second caps 706 and 710 are not covered by encapsulating material 120. An IC package may be in the form of this embodiment if first and second caps 706 and 710 are added to package 704 after encapsulating material 120 (e.g., a molding compound) has been applied.

Figure 7D:
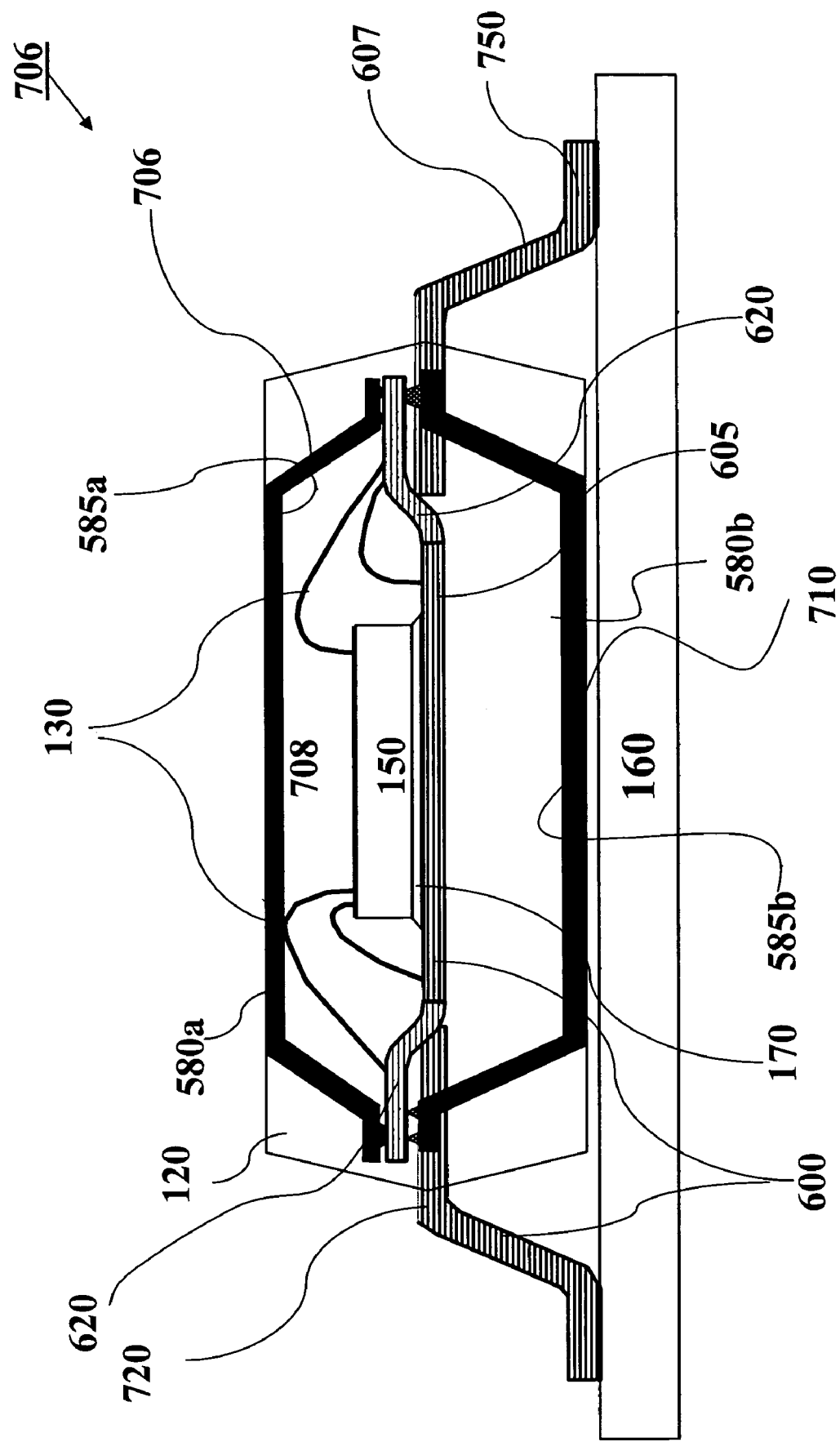
Figure 7E:
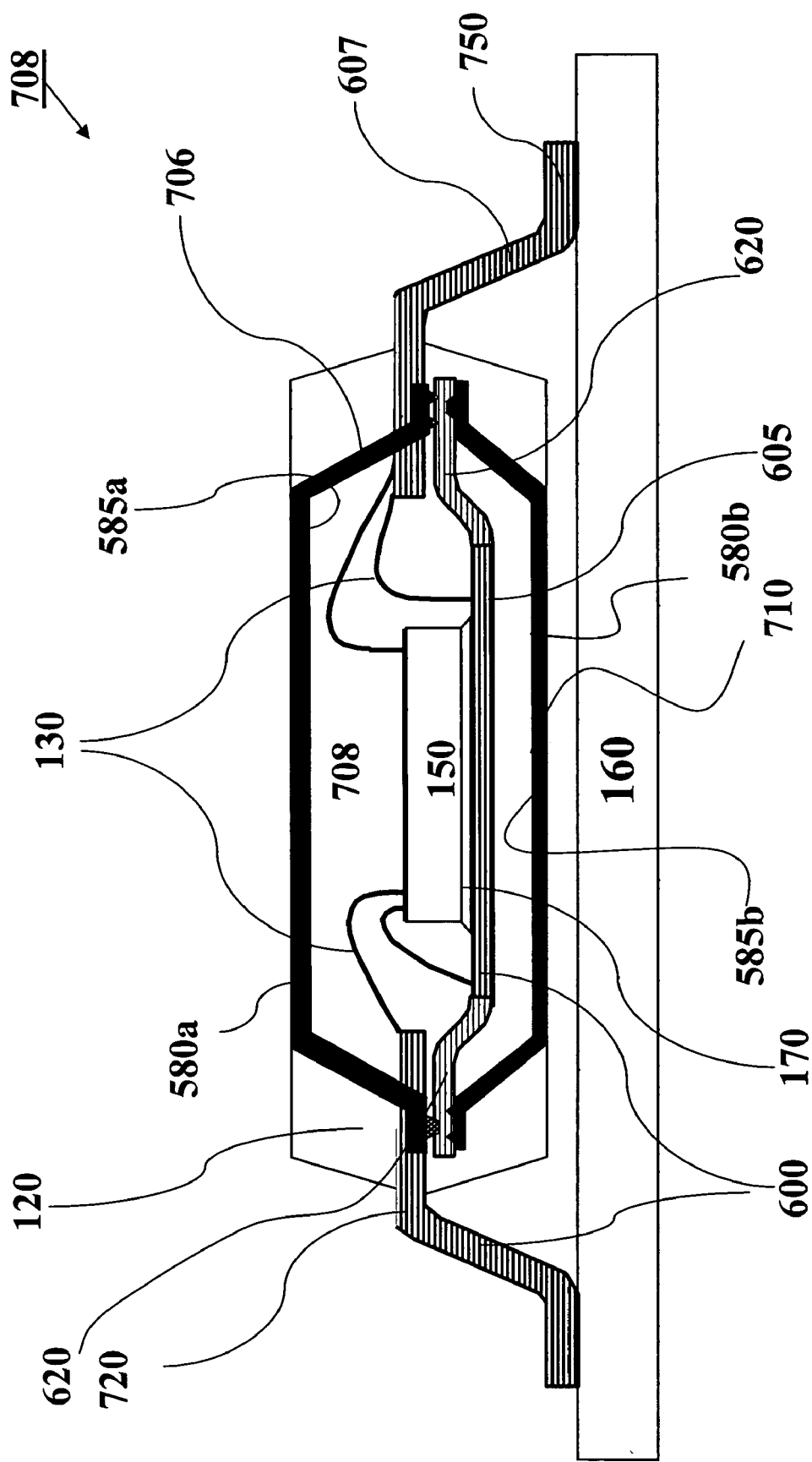

As illustrated in FIG. 7D, leadframe 600 may have tie bars 620 on a different plane than the leadframe bond fingers or leads 750. In the embodiment of FIG. 7D, tie bars 620 are above leads 750. In the embodiment of FIG. 7E, tie bars 620 are below leads 750. The embodiment of FIG. 7E has the advantage of requiring shorter wirebonds 130 from the top of IC die 150 to leads 750, relative to the embodiment of FIG. 7D.

Figure 7F:
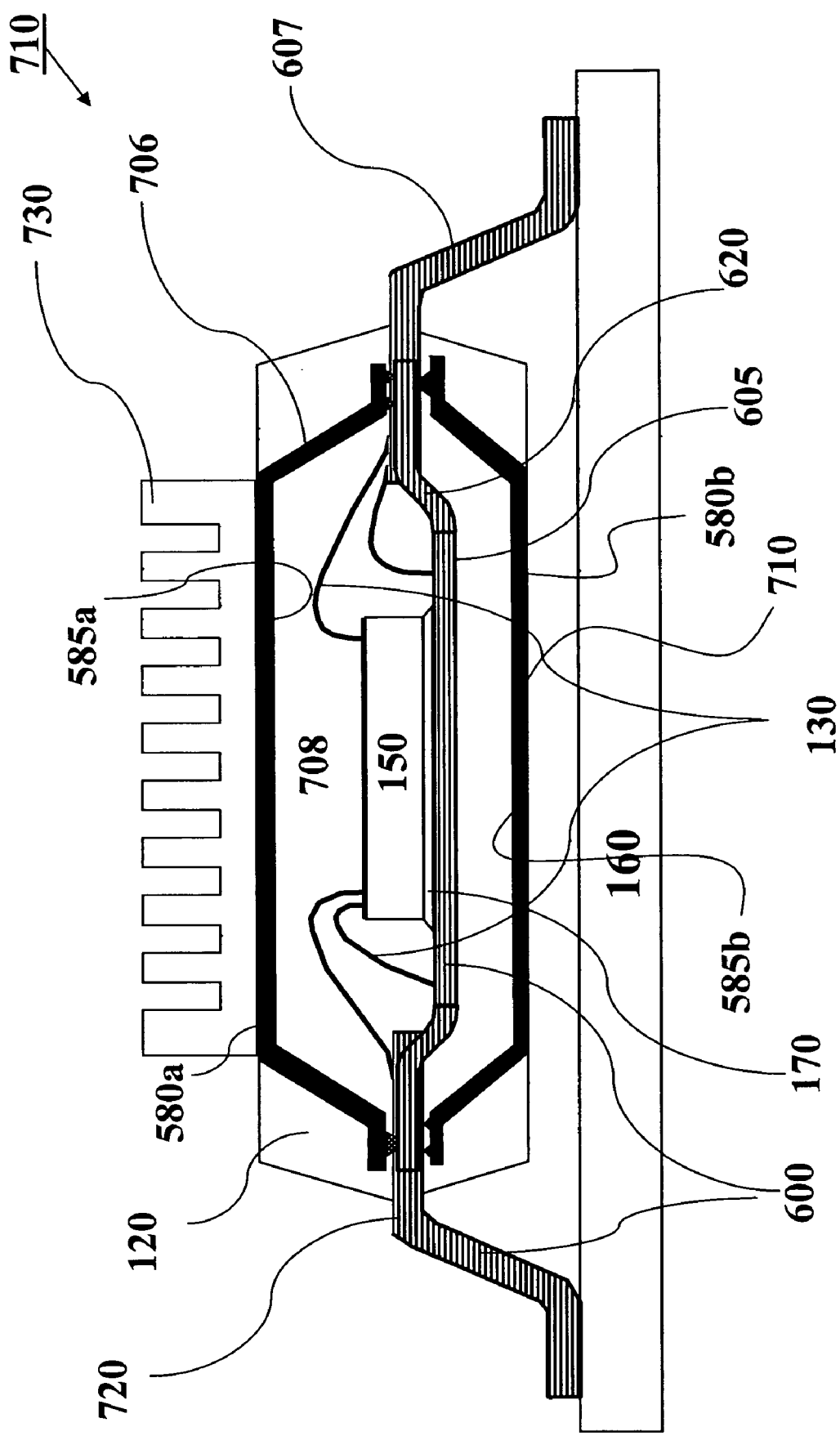
Figure 7G:
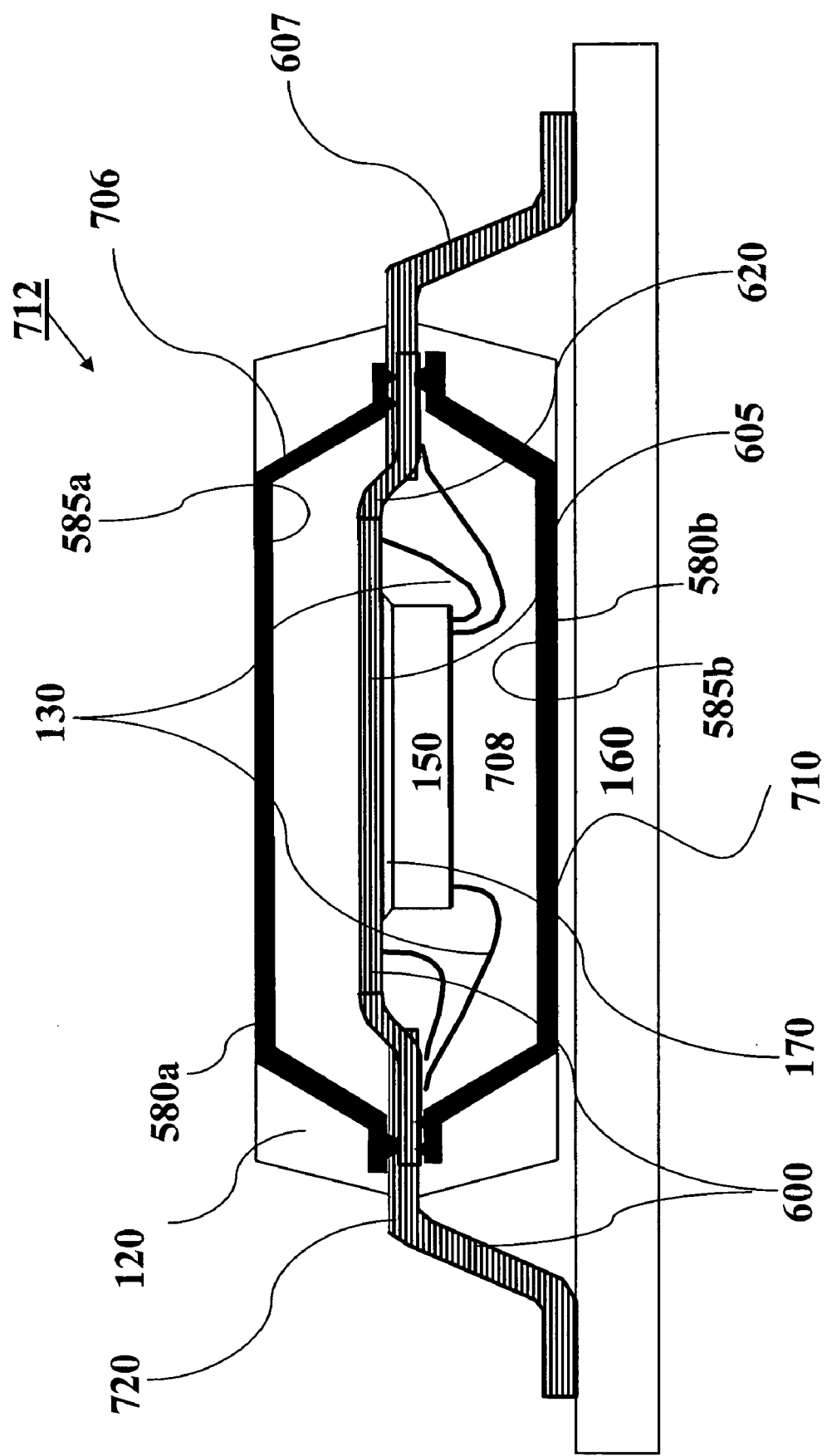
Figure 7H:
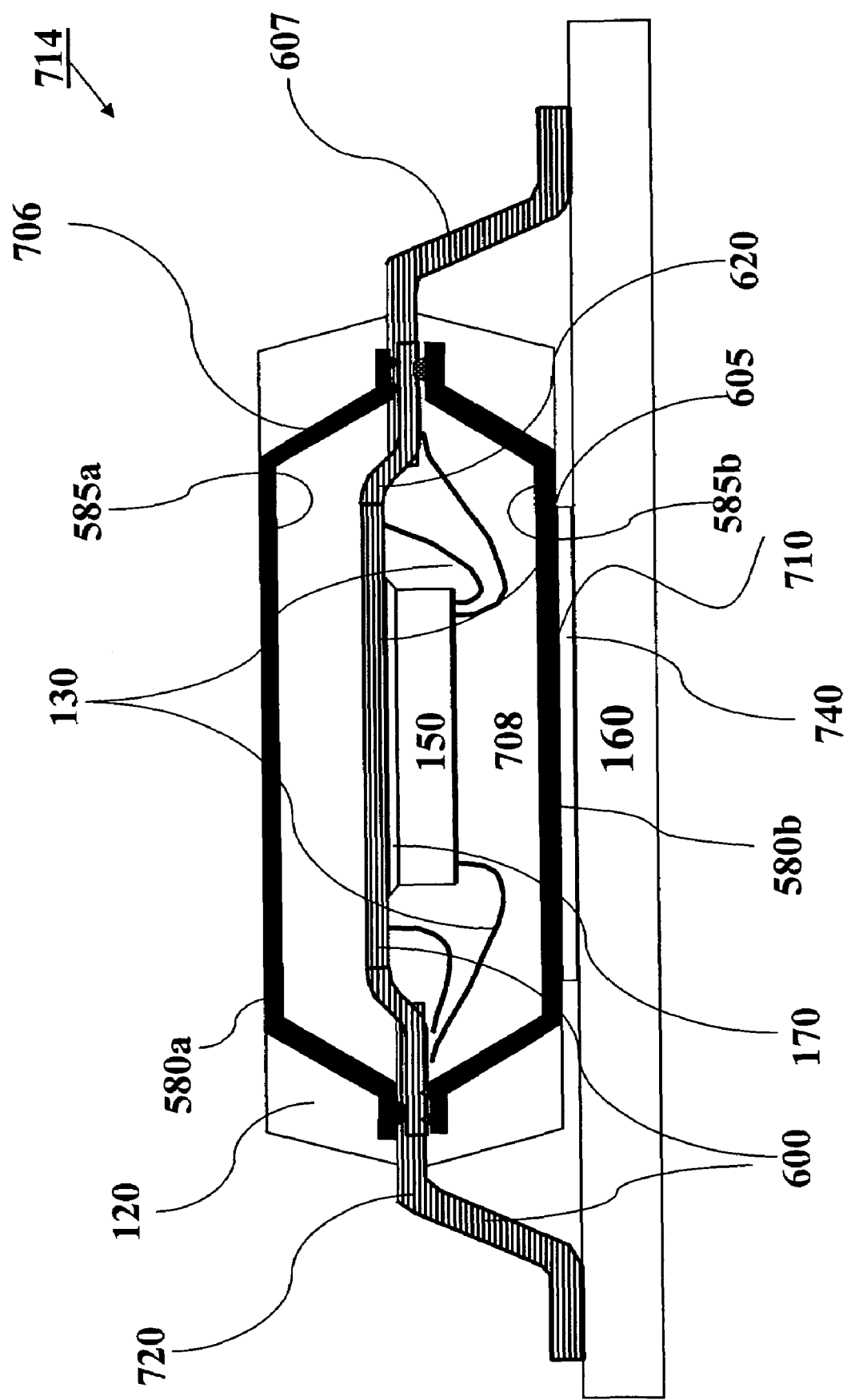

FIG. 7F shows an IC package 710 where first cap 706 is configured to mount an external heat sink 730. Leadframe 600 and first cap 706 provide a path for heat to be conducted from die 150 to heat sink 730, and thus out of package 710.

Embodiments of the present invention are not restricted to die-up configurations. FIG. 7G illustrates a package 712 in a die-down configuration, according to an example embodiment of the present invention. In comparison to package 700 in FIG. 7A, surface 580b of cap 710 is exposed on the bottom side of package 712. The features reflected in the embodiments illustrated in FIGS. 7A-7F are applicable to the die-down configuration embodiments illustrated in FIGS. 7G and 7H. FIG. 7H illustrates a package 714, according to another embodiment of the present invention. In package 714, exposed surface 580b of cap 710 is coupled to circuit board 160 with electrically and/or thermally conductive adhesive or solder 740. The circuit board may be any type of circuit board such as a PCB, PWB, etc. as understood by someone skilled in the art. Thus, heat conducted from IC die 150 through leadframe 600 and cap 710 may be conducted out of package 714 into circuit board 160. Surface 580b of cap 710 may be electrically connected to a power pad or pads (not shown in FIG. 7H) on circuit board 160 to improve EMI shielding and power delivery from package 714. Alternatively, surface 580b of cap 710 may be electrically connected to ground pad or pads (not shown in FIG. 7H) on circuit board 160 to improve EMI shielding and current return from package 714.

Figure 7I:
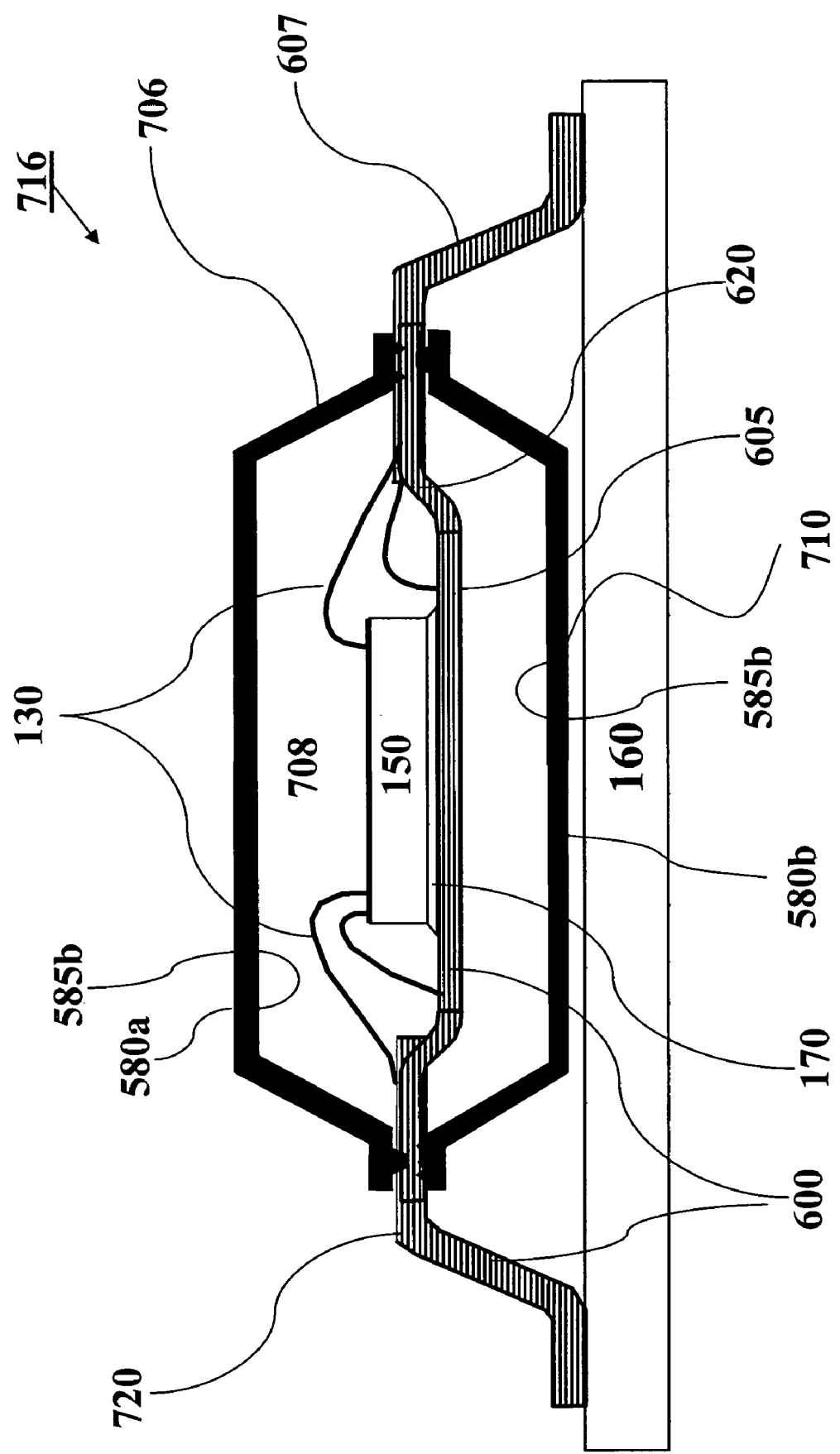

Microphonics can further be reduced by using a leadframe IC package 704 structure as shown in FIG. 7I. In this case, FIG. 7I shows semiconductor die 150 not being encapsulated in a molding compound for environment protection. First and second caps 706 and 710 are attached to the leadframe 600 on both sides for environment protection and EMI shielding of semiconductor die 150. An advantage of the embodiment of FIG. 7I is that mechanical stresses originated or transferred from the mold compound encapsulation on the IC die 150 are eliminated. This is desirable for reduction of microphonics in large scale integrated (LSI) electronic circuitry. Vibration, mechanical shock, pressure and forces, or sudden change in temperature can cause a change of stress distribution applied to IC die 150 and alter the capacitance and resistance such that a voltage vibration or drift is produced. The embodiment of FIG. 7I removes mold compound in contact with IC die 150. In a plastic molded leadframe package, a coefficient of thermal expansion (CTE) is very different between materials. For example, CTE=2.7–3.5 ppm/° C. for silicon, CTE=13 ppm/° C. for plastic mold, CTE=17.2 ppm/° C. for copper leadframe. Refer to C. A. Happer, Electronic Packaging and Interconnection Handbook, 3rd. ed. McGraw-Hill, N.Y., 2000, Table 7.8 on page 7.60. A difference in CTE values, also known as CTE mismatch, causes mechanical stress within a package when different materials expand at different rates when temperature rises. Stress due to uneven expansion within materials caused by changes in temperature is called thermal stress.

Figure 7J:
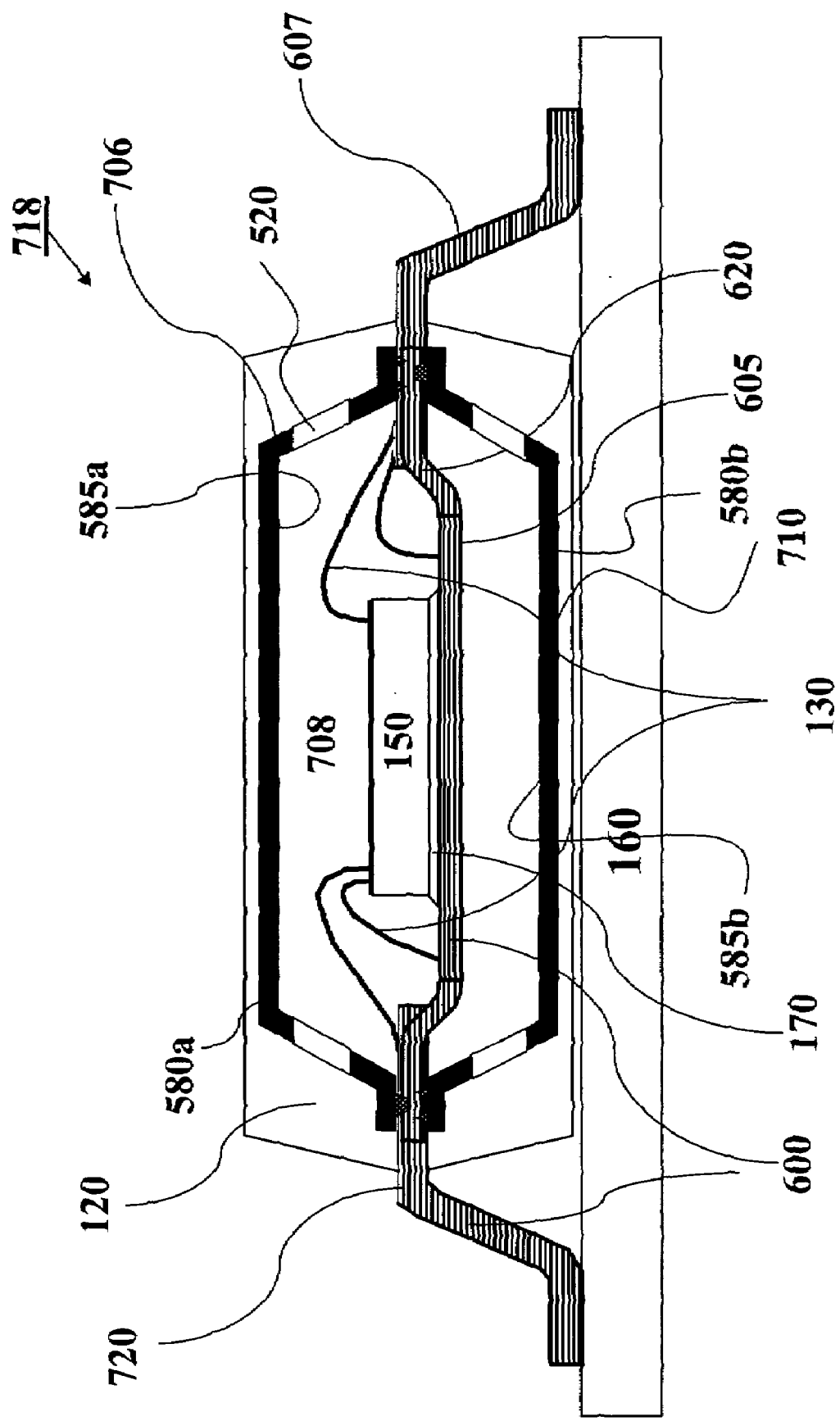

FIG. 7J shows IC package 718 where first and second caps 706 and 710 are completely encapsulated in the mold compound. Furthermore, caps 706 and 710 have slot openings 520 that can be used for mold flow during injection molding for die encapsulation. When the metal cap cavity 708 diameter is large, mold flow through the openings on the sidewall of the metal cap into the center region above the die can be difficult and may require extremely high pressure for molding. It is often preferable then to have a plurality of circular openings on the top of the metal cap as shown in FIG. 5E for mold injection flow.

Figure 7K:
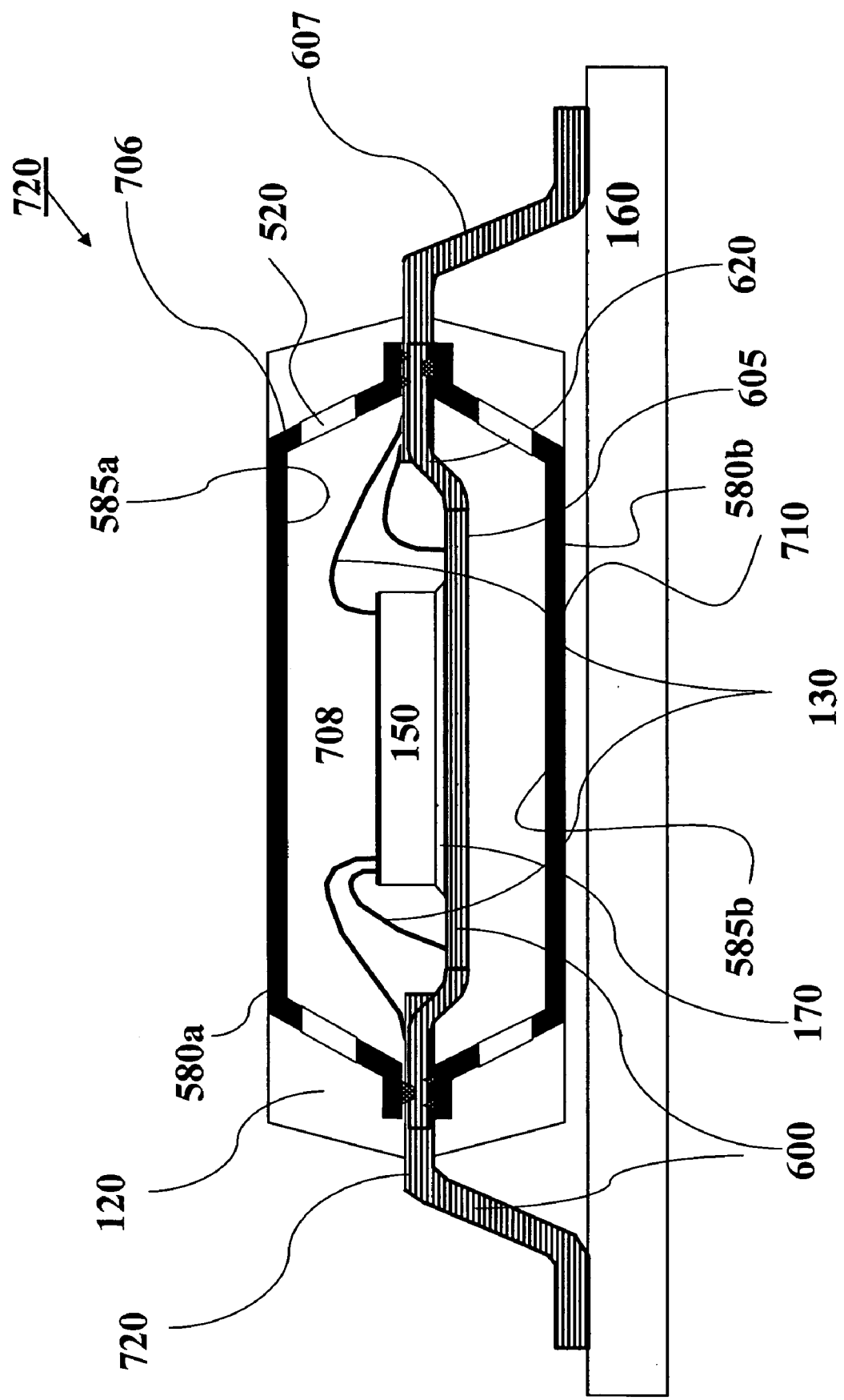

FIG. 7K shows IC package 720 that is substantially similar to package 718 of FIG. 7J, however the surfaces of caps 706 and 710 are partially exposed on the top and bottom surfaces of the mold.

Figure 7L:
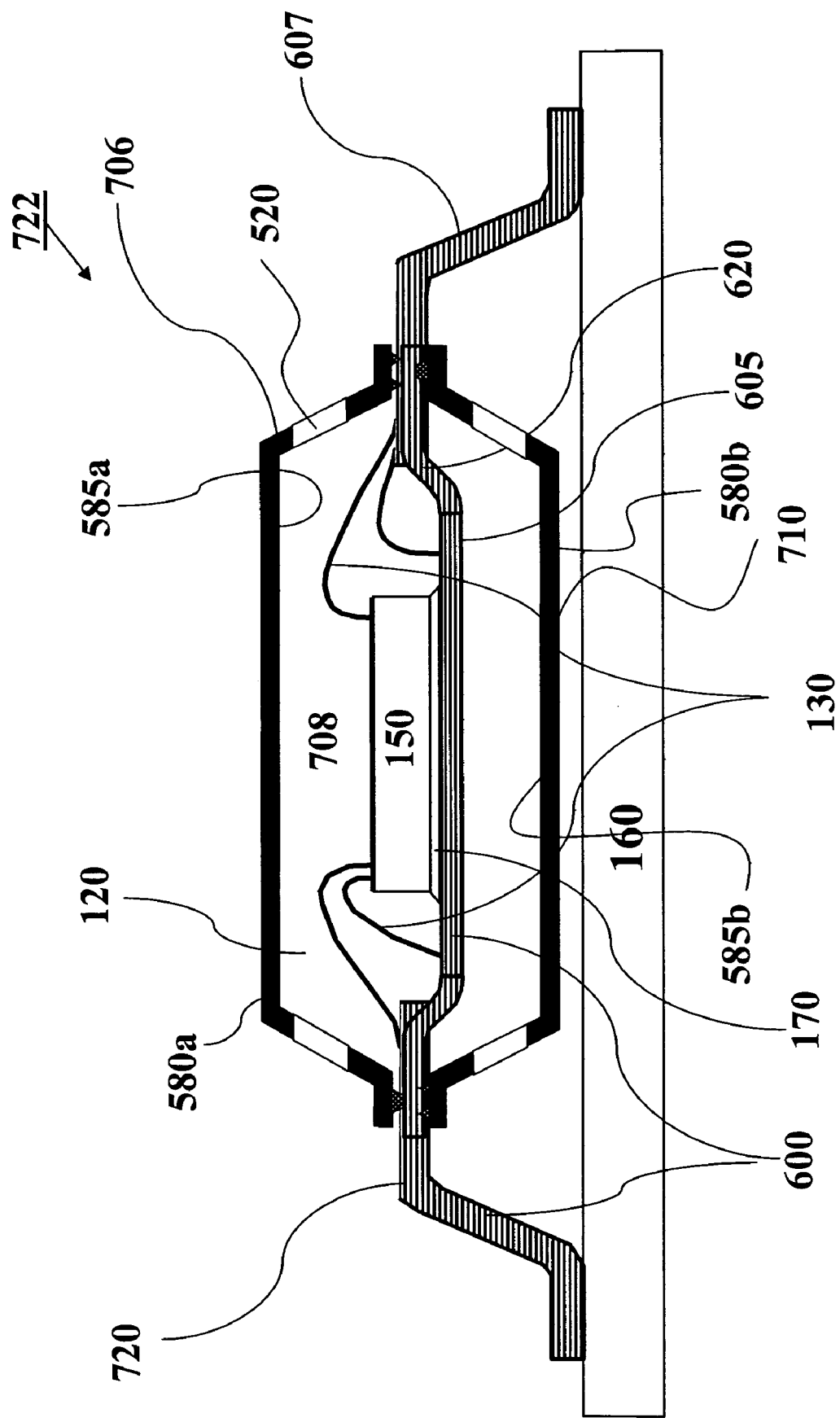

FIG. 7L shows IC package 722 that is substantially similar to package 720 of FIG. 7K, however the surfaces of caps 706 and 710 are completely exposed on the top and bottom surfaces of the mold.

Figure 7M:
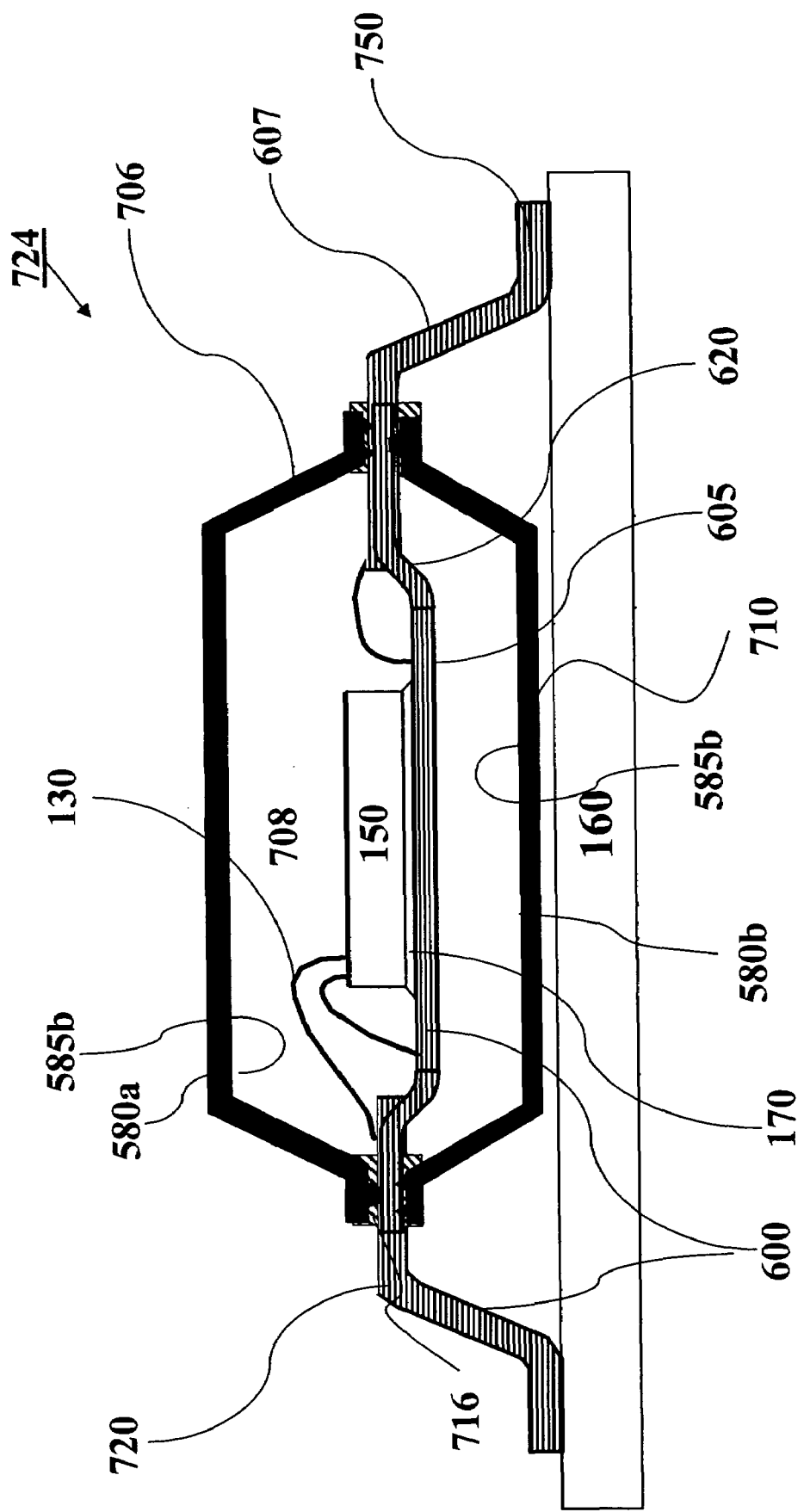
Figure 11A:
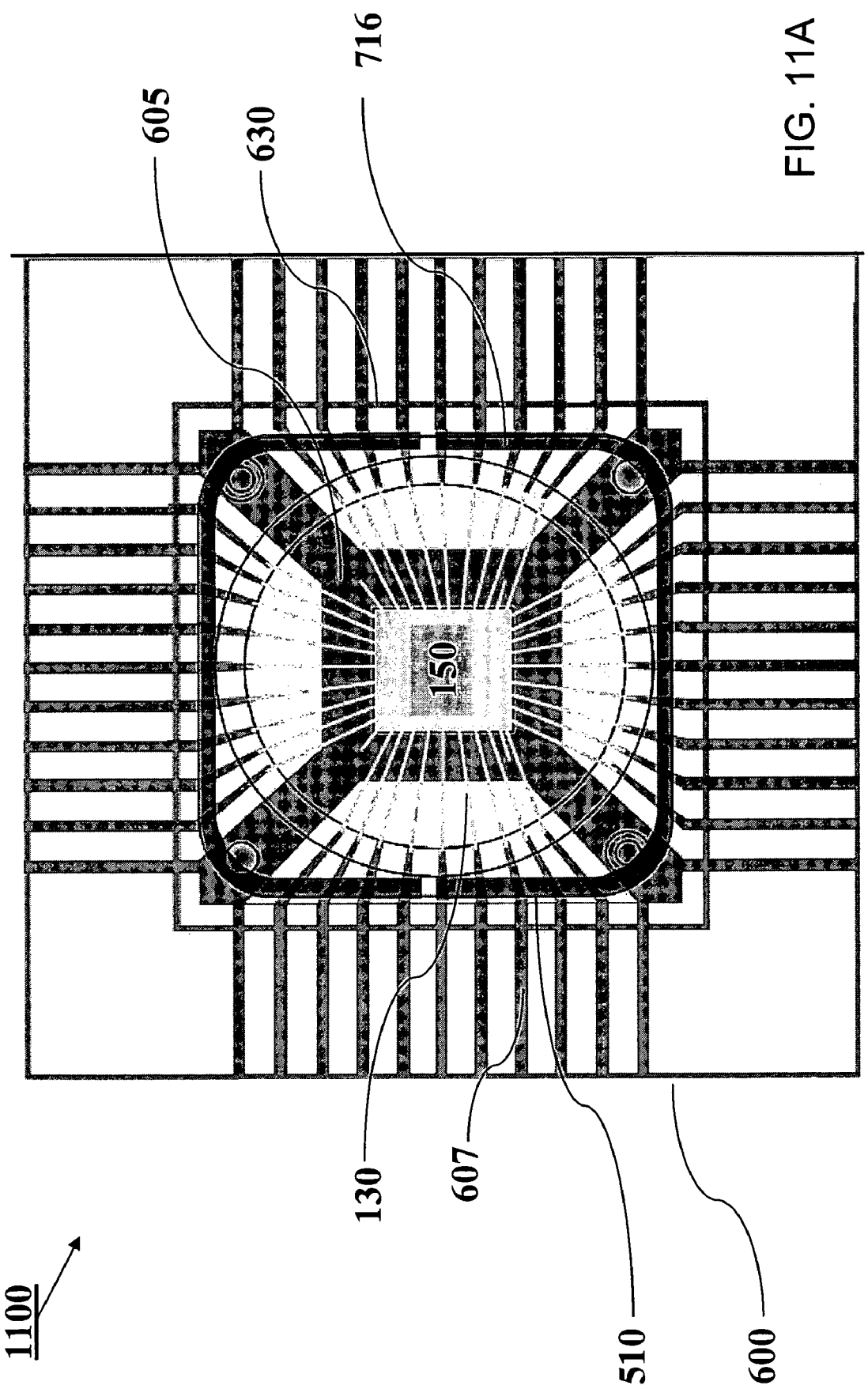
FIGS. 11A-11C illustrate some ways of implementing a seal ring.
Figure 11B:
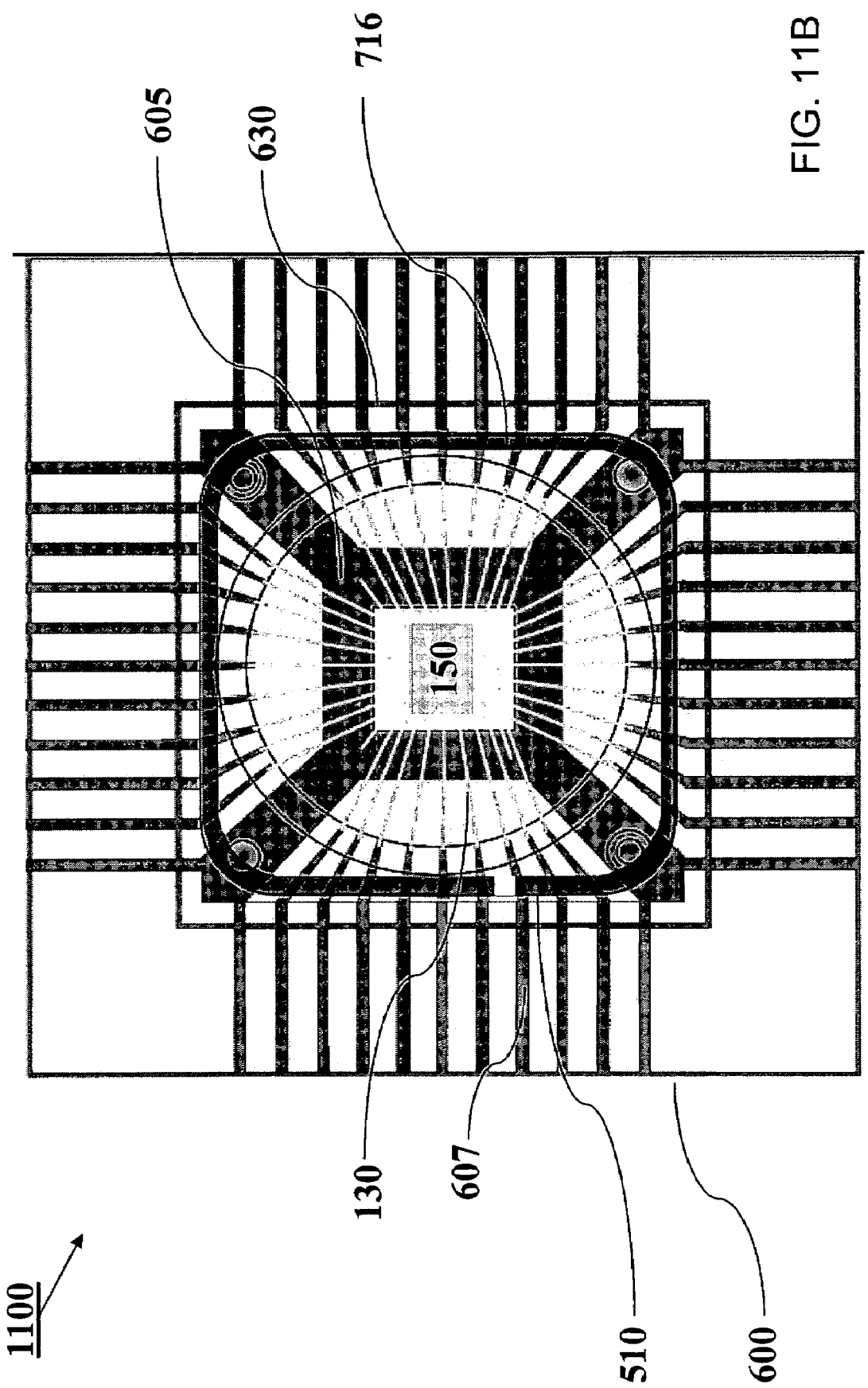
Figure 11C:
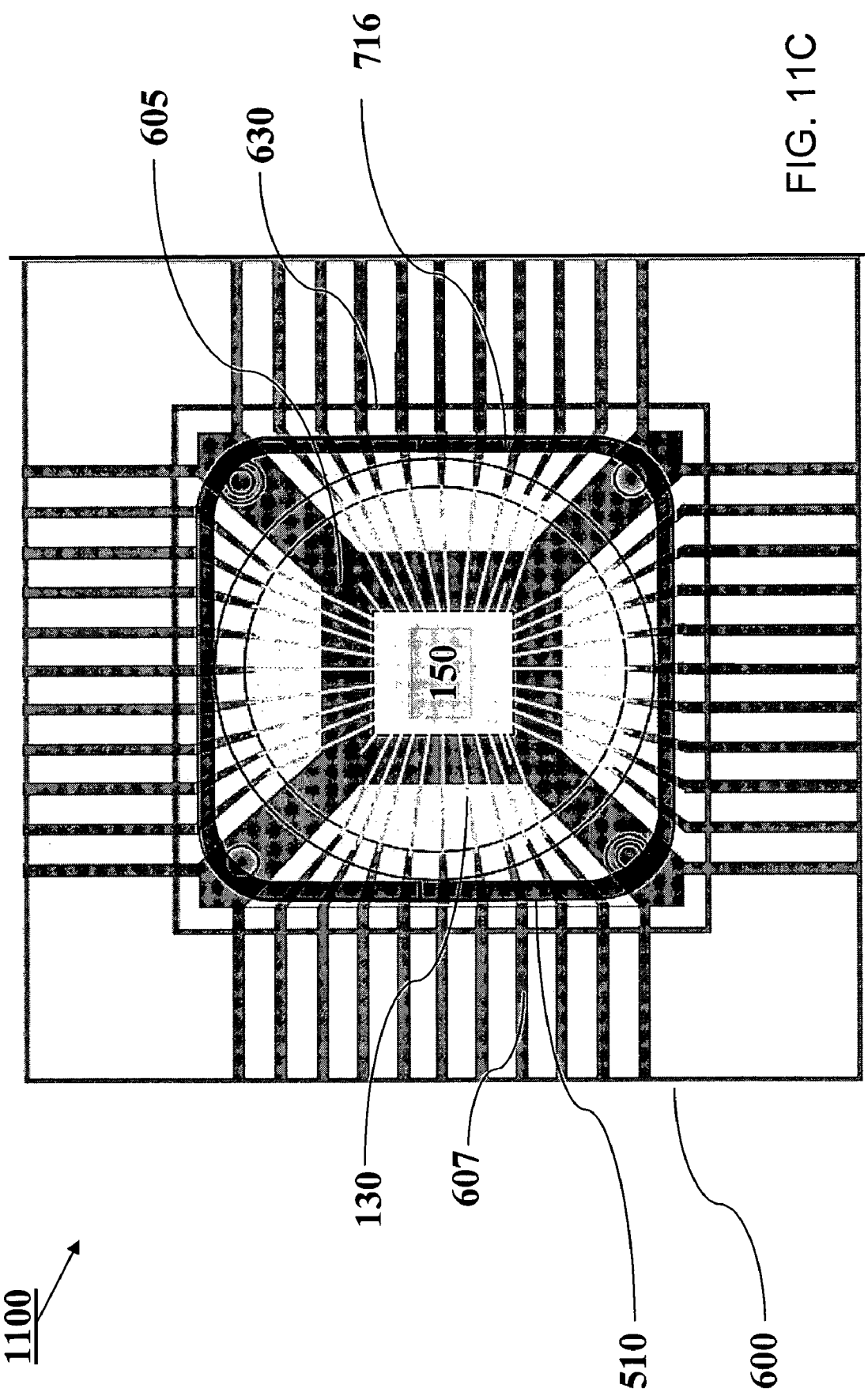

FIG. 7M shows IC package 724 that is substantially similar to package 716 of FIG. 7I, but package 724 includes seal ring 716 that is used to seal gaps between the heat spreader tabs 750 and the lead frame 720. In a preferred embodiment, the seal ring consists of an electrically non-conductive adhesive such as an epoxy, a thermoset adhesive, a molding compound, etc. FIGS. 11A-11C show different configurations for seal layer 716. FIG. 11A shows a plan view of IC package 1100 where the seal ring 716 is shown to have separate sections. Although FIG. 11A shows seal ring 716 with two separate, in other embodiments the seal ring could have any number of sections as understood by someone skilled in the art. FIG. 11B shows a plan view of IC package 1102 where the seal ring 716 is one continuous ring which is not closed. In preferred embodiments gaps where a ring is either not closed or gaps that separate sections are filled with air to allow pressure balance between the air within the cavity 708 (not shown) and the ambient. FIG. 11C shows a plan view of IC package 1104 where the seal ring 716 is one continuous ring which is not closed.

In order to reduce problems of thermal stress, first and second caps 706 and 710 maybe symmetrically placed on both sides (top and bottom) of leadframe 600 to form a symmetric cavity 708 (within enclosure structure 702). Thermal stress is compensated and reduced for in such symmetrically constructed packages. Furthermore, enclosure structure 702 may be filled with an inert gas like Helium, Neon, Argon, etc.

Furthermore, first and second caps 706 and 710 add mass to the die support (e.g. DAP 605) that aid in reducing microphonics caused by stresses induced by vibration or shock. Attachment of semiconductor die 150 to the DAP 605, which is suspended within enclosure structure 702 increases mass and helps damp mechanical shock or vibrations from affecting die 150 and package 704.

Example Manufacturing Processes

Figure 10A:
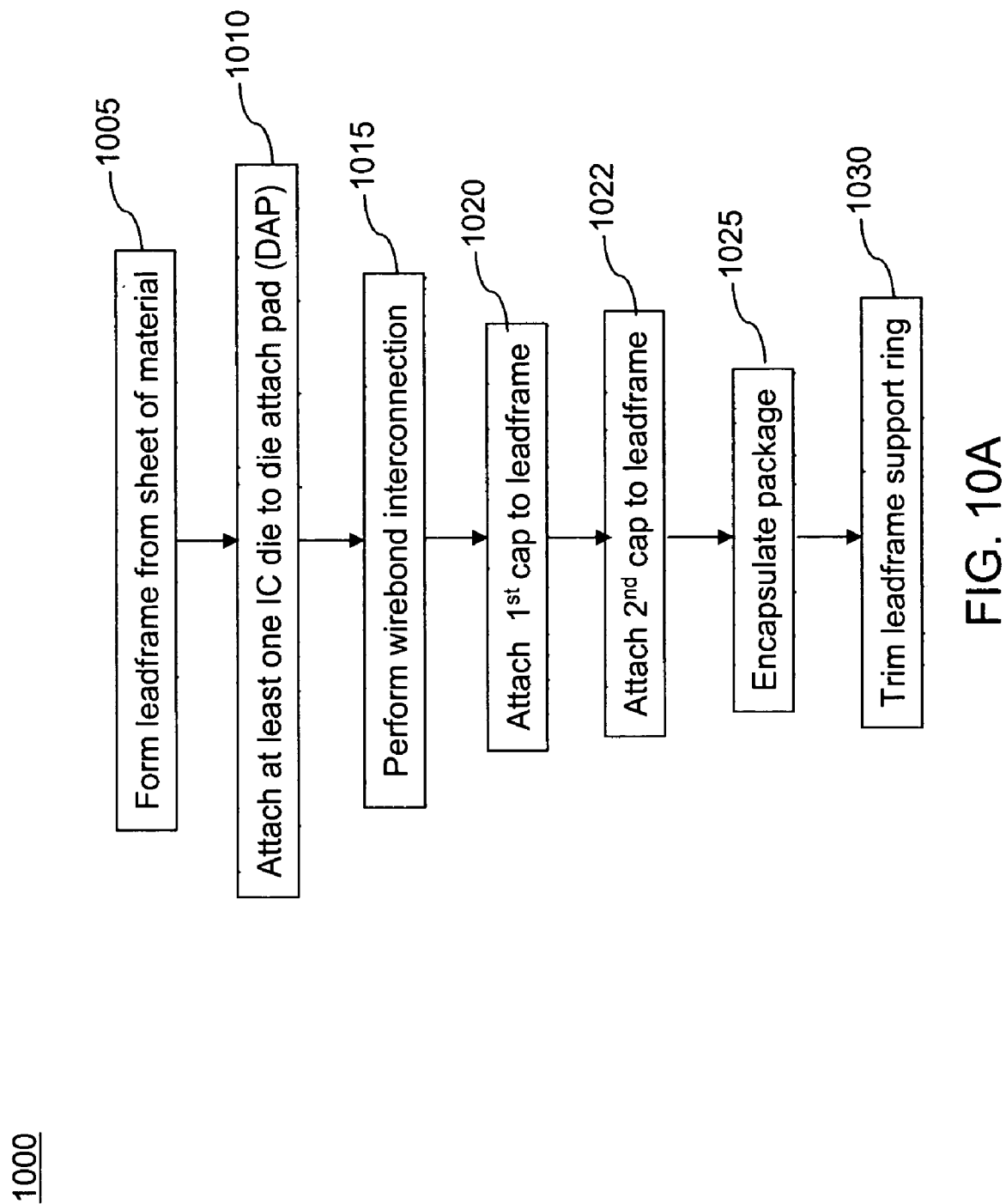
FIGS. 10A and 10B show flowcharts illustrating example embodiments for assembling leadframe IC packages, according to embodiments of the invention.
Figure 10B:
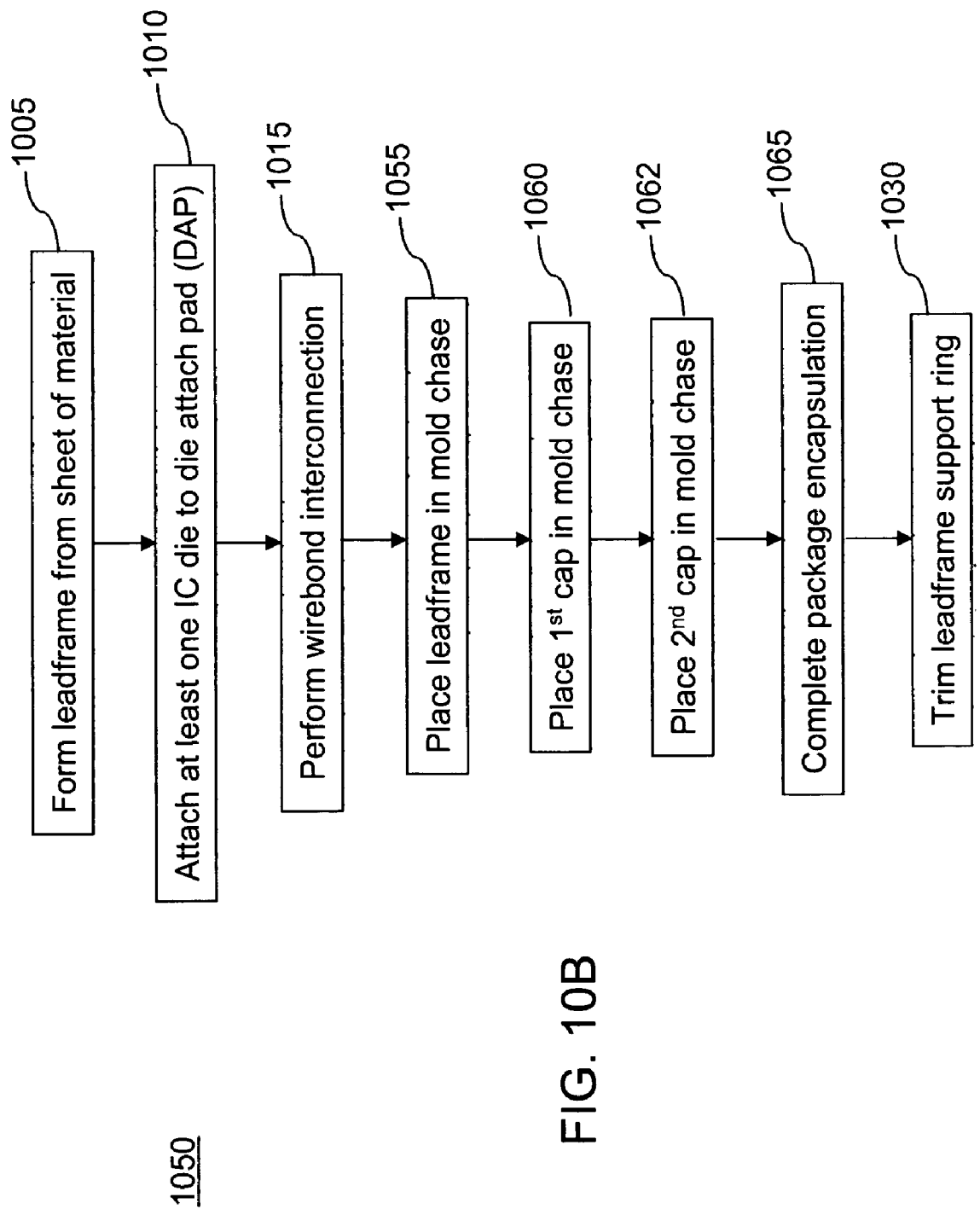

FIG. 10A shows flowchart 1000 illustrating example steps to assemble leadframe package 700 shown in FIG. 7A, according to an embodiment of the present invention. FIG. 10B shows flowchart 1050 illustrating example steps for an alternate method to assemble package 700. As would be understood by one skilled in the art, these assembly processes can be adapted to assemble any embodiments, including those illustrated in FIGS. 7A-7I. The steps in FIGS. 10A and 10B do not necessarily have to occur in the order shown, as will be apparent to persons skilled in the relevant art(s) based on the teachings herein. Other operational and structural embodiments will be apparent to persons skilled in the relevant art(s) based on the following discussion. These steps are described in detail below with respect to FIGS. 8A-8E and 9A-9D, for illustrative purposes. FIGS. 8A-8E illustrate top views and FIGS. 9A-9D show side views of embodiments of the invention at different stages of assembly.

Figure 8A:
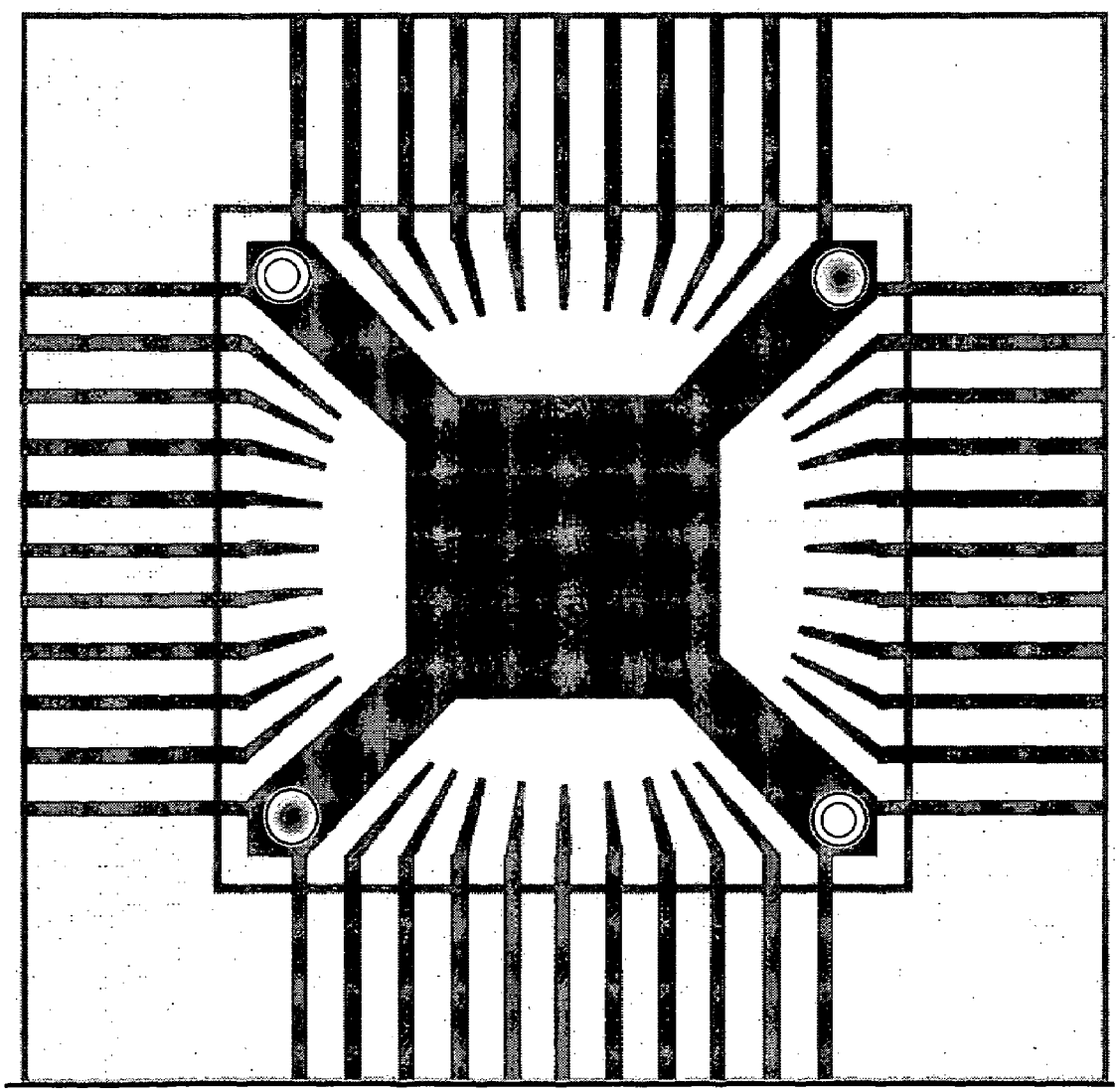
Figure 8B:
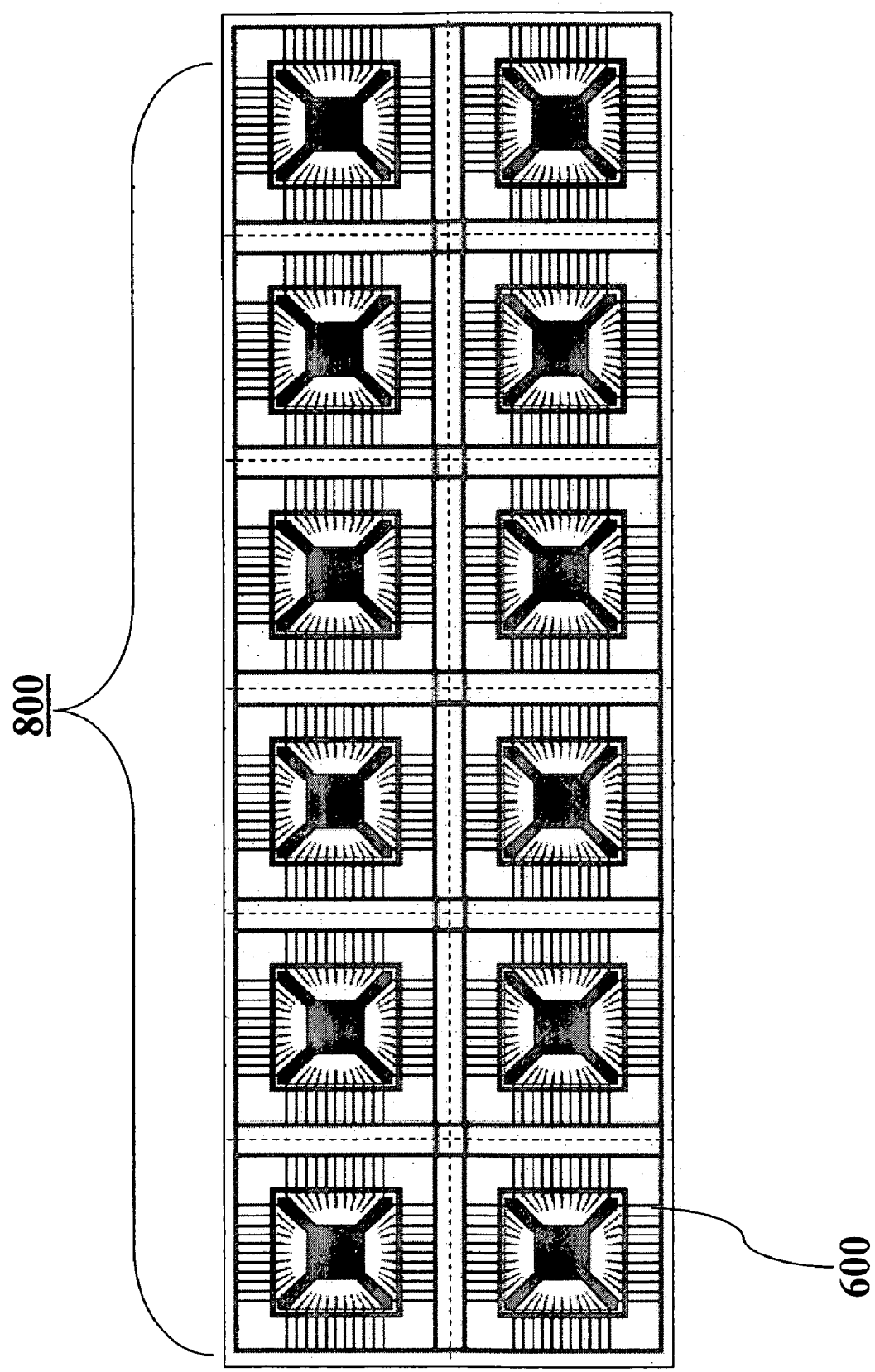

Flowchart 1000 is shown in FIG. 10A, and begins with step 1005. In step 1005, a leadframe 600 is formed from a sheet of material. Example leadframe materials and features are discussed elsewhere herein. FIG. 8A illustrates a view of a single leadframe 600. FIG. 8B illustrates an example leadframe panel 800 that contains an array of leadframes 600. Leadframes 600 in leadframe panel 800 may be manufactured by any of a variety of processes, including a molding process, an etching process or a stamping process, for example.

In step 1010, at least one IC die 150 is attached to a DAP 605 of a leadframe 600. IC die 150 is attached using a thermally and/or electrically conductive adhesive 170 (such as solder or epoxy containing metal or other conductive particles or flakes). FIG. 9A illustrates a side view of an embodiment at this stage of assembly. For example, as shown in FIG. 9A a die 150 has been attached to each of DAPs 605a-e.

In step 1015, wirebonds 130 are interconnected between pads of IC die 150 and leadframe 600, providing electrical connections from IC die 150 to leads 607, tie bars 620, and/or DAP 605.

Figure 8C:
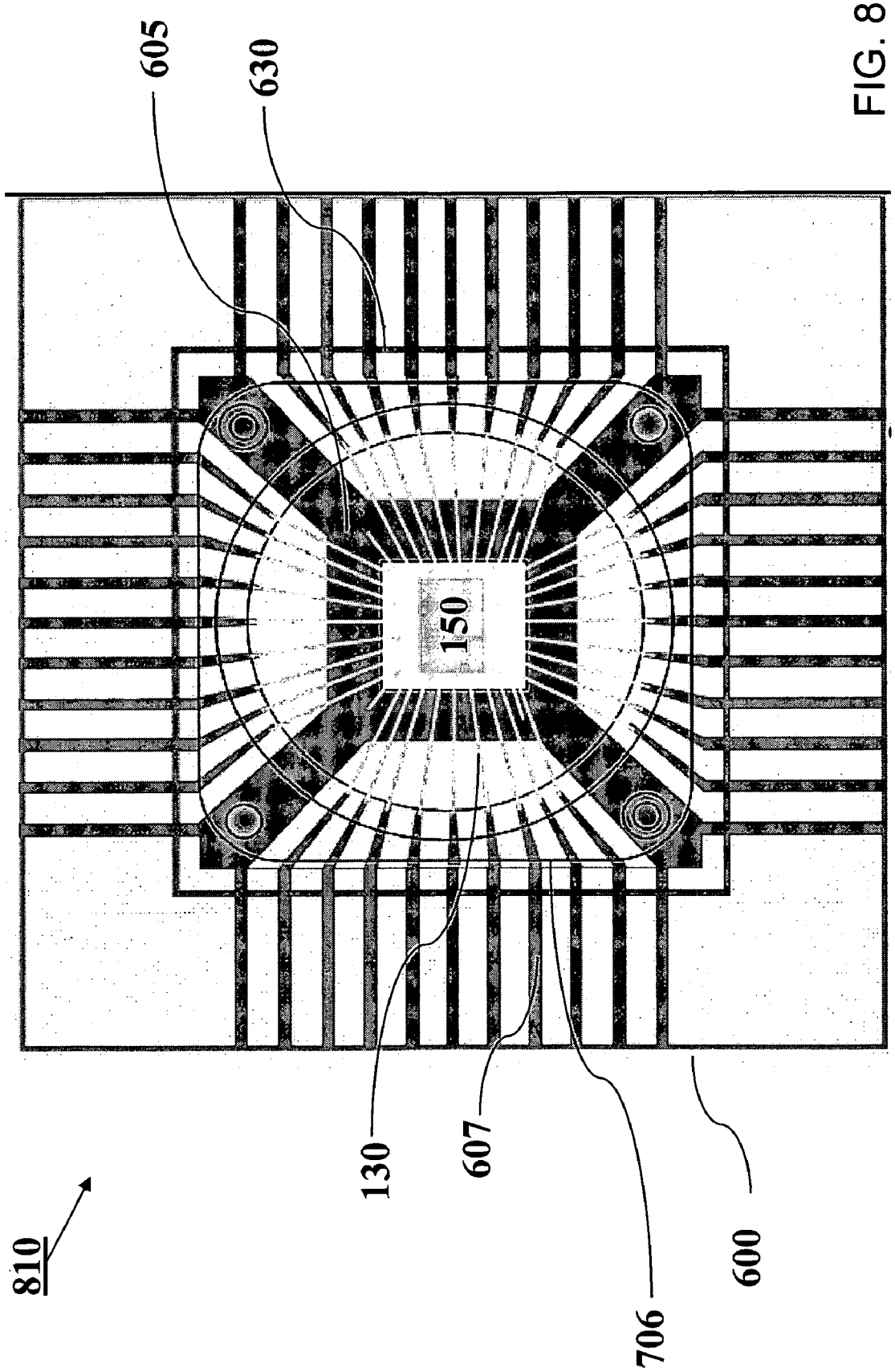
Figure 8E:
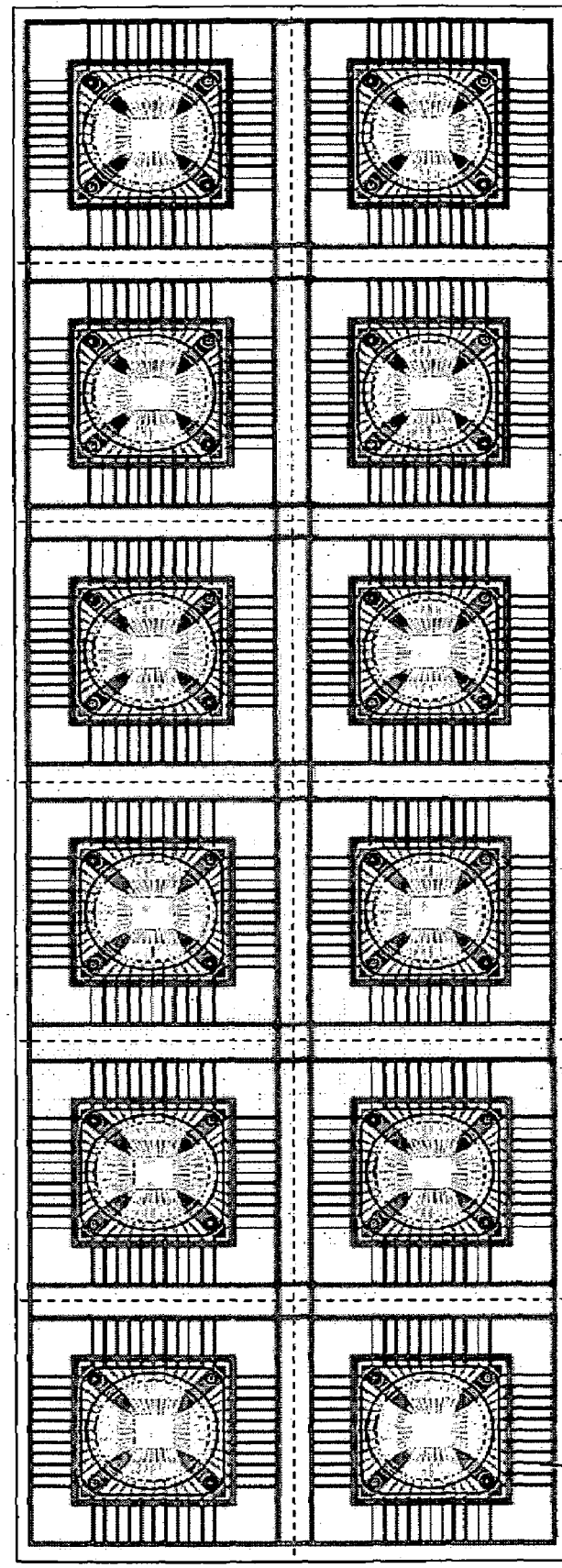

In step 1020, first cap 706 is attached to leadframe 600. FIG. 8C shows a partially assembled package 810, illustrating an example embodiment leadframe package at this stage of assembly. As shown in FIG. 8C, first cap 706 is mounted to leadframe 600. FIG. 8E illustrates a partially assembled panel 820 of partially assembled packages 810. FIG. 9B shows a side view of partially assembled panel 820. As shown in FIG. 9B, a first cap 706 is coupled to each of leadframes 600a-600e.

In step 1022, second cap 710 is attached to leadframe 600. As shown in FIG. 8D, second cap 710 is mounted to leadframe 600. Electrically and/or thermally conductive adhesive materials may be used to improve coupling between first cap 706, second cap 710 and leadframe 600. First cap 706, second cap 710 and leadframe 600 are joined to form an enclosure structure (e.g., enclosure structure 702) which substantially encloses IC die 150. As shown in FIG. 9C, a second cap 710 is coupled to each of leadframes 600a-600e.

In step 1025, an encapsulating process encapsulates partially assembled package 810 in encapsulating material 120. In an embodiment, package or packages 810 may be clamped in a mold chassis to mold or shape a molding compound being used to encapsulate the package. FIG. 9D shows a side view of an encapsulated panel 910 of leadframe packages 700 at this stage of assembly. As described elsewhere herein, in an embodiment, an outer peripheral dimension of first and second caps 706 and 710 is smaller than a peripheral dimension of peripheral support ring 630. This prevents the encapsulating material from bleeding through gaps between leads 607. Inner support ring 630 may also provide sealing between the clamped mold chassis during the transfer molding process.

Inner and perimeter leadframe support rings 630 and 632 are trimmed in step 1030. Leads 607 are ready to be formed into contact pins for board mount and a leadframe package 700 is completely assembled. For example, the outer portion of leads 607 extending from the package may be bent to allow them to contact a circuit board, where the circuit board could be a PCB, PWB, etc. as understood by someone skilled in the art. For example, leads 607 may be bent to form an "L" or "hockey stick" type shape. Furthermore, leads 607 may be bent toward a side of the package away from die 150 to form a "die up" package, or may be bent toward a side of the package toward die 150 to form a "die down" package.

Flowchart 1050 shown in FIG. 10B shows example steps for forming an integrated circuit package, according to another embodiment of the present invention. Steps 1005-1015 are the same as shown in FIG. 10A. However, instead of coupling first cap 706 and second cap 710 to leadframe 600 outside of the molding chassis, leadframe 600 and first and second caps 706 and 710 are put into the mold chassis for steps 1055, 1060 and 1062.

In step 1065, a molding process takes place. When the mold chassis are clamped together in this step, leadframe 600, first cap 510 and second cap 710 are coupled together, and in an embodiment, may be held together by a molding compound.

FIGS. 12A-12B illustrate an example design for a cap. FIG. 12A shows a horizontal view and FIG. 12B shows a top view of cap 1200 shaped as an inverted cup with slot openings 520 and standoff distance 1202 which has leadframe contact stands on it four corners.

FIGS. 13A-13B show horizontal and top views respectively of another example design cap substantially similar to cap 1200 shown in FIGS. 12A-12B. In addition to the slot openings 520 and the standoff distance 1202, cap 1300 also has leadframe contact stands with fused leads 1302. The location of the contact stands 1302 can be optimized based on leadframe design.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) device package, comprising:
   an IC die;
   a first cap;
   a second cap; and
   a leadframe having opposing first and second surfaces, comprising
      a centrally located die attach pad;
      a plurality of leads emanating in an outward direction from the die; and
      a plurality of tie bars, each tie bar having an end connected to the die attach pad;
   wherein the IC die is mounted to the die attach pad;
   wherein the first cap is mounted to the first surface of the leadframe, a planar rim portion of the first cap being coupled to the first surface of the leadframe;
   wherein the second cap is mounted to the second surface of the leadframe, a planar rim portion of the second cap being coupled to the second surface of the leadframe;
   wherein the first and second caps and the leadframe form an enclosure structure that substantially encloses the IC die; and
   wherein at least one of the plurality of tie bars is wider relative to others of the plurality of tie bars.

2. The package of claim 1, wherein the first cap and the second cap are electrically coupled to an electrical potential to shield electromagnetic interference (EMI) emanating from the IC die, and to shield the IC die from EMI radiating towards it from outside the package.

3. The package of claim 1, wherein an electrical potential of the IC die is coupled to the die attach pad.

4. The package of claim 3, wherein at least one lead of the plurality of leads is coupled to at least one tie bar of the plurality of tie bars, whereby the die attach pad is electrically coupled to at least one of the leads of the plurality of leads.

5. The package of claim 4, wherein the first cap and the second cap are electrically coupled to the lead to couple the first cap and the second cap to the electrical potential, whereby the enclosure structure forms a Faraday Cage.

6. The package of claim 3, wherein each tie bar of the plurality of tie bars is electrically isolated from each lead of the plurality of leads, wherein at least one wirebond couples the die attach pad to at least one lead of the plurality of leads.

7. The package of claim 6, wherein the first cap and the second cap are electrically coupled to at least one tie bar of the plurality of tie bars to couple the first cap and the second cap to the electrical potential, whereby the enclosure structure forms a Faraday Cage.

8. The package of claim 3, wherein each tie bar of the plurality of tie bars is electrically isolated from each lead of the plurality of leads, wherein at least one wirebond couples at least one bond pad on a first surface of the IC die to at least one lead.

9. The package of claim 8, wherein the first cap and the second cap are electrically coupled to at least one tie bar of the plurality of tie bars to couple the first cap and the second cap to the electrical potential, whereby the enclosure structure forms a Faraday Cage.

10. The package of claim 3, wherein at least one lead is fused to the die attach pad forming a fused lead.

11. The package of claim 10, wherein the first cap and the second cap are electrically coupled to the fused lead to couple the first cap and the second cap to the electrical potential, whereby the enclosure structure forms a Faraday Cage.

12. The package of claim 1, wherein the plurality of tie bars and the plurality of leads are not coplanar, wherein at least one of wire bonds couples at least one tie bar to at least one lead.

13. The package of claim 1, wherein the die is enclosed in a cavity by the first and second caps, wherein an inert gas fills the cavity.

14. The package of claim 1, wherein the die is positioned between the die attach pad and a side of the package configured to mount to a printed circuit board.

15. The package of claim 1, wherein the die attach pad is located between the IC die and a side of the package configured to mount to a circuit board.

16. The package of claim 1, wherein at least a portion of the planar rim portion of the cap is coated with a dielectric material;
   whereby the cap is electrically isolated from any of the plurality of leads.

17. The package of claim 1, wherein at least one of the plurality leads is a fused lead that is wider relative to the others of the plurality of leads.

18. The package of claim 1, further comprising:
   at least one tab protruding from the planar rim portion; and
   at least one receptacle formed in a surface of the leadframe corresponding to the at least one tab, wherein the at least one tab is coupled with the at least one corresponding receptacle, whereby structural coupling of the cap to the leadframe is substantially improved.

19. The package of claim 1, further comprising:
   an encapsulating material that encapsulates the IC die.

20. The package of claim 1, wherein the first cap has an outer surface that opposes a cavity formed between the first and second caps, wherein the first cap further comprises:
   at least one opening through the first cap that is open at the outer surface and in the cavity.

21. The package of claim 1, wherein the first cap has an outer surface that opposes a cavity formed between the first and second caps, wherein the first cap further comprises:
   at least one opening through the first cap facilitates flow of an encapsulating material into the cavity.

22. The package of claim 1, wherein the first cap has an outer surface that opposes the cavity formed between the first and second caps, wherein the first cap further comprises:
   at least one opening through the first cap facilitates release of an air pressure inside of the enclosure structure.

23. The package of claim 1, wherein the first cap has an outer surface that opposes the cavity formed between the first and second caps, further comprising:
   a heat sink coupled to the outer surface of the first cap.

24. The package of claim 1, wherein a thermally and electrically conductive coupling means is used to couple the first cap to a circuit board.

25. The package of claim 24, wherein, the coupling means comprises solder.

26. The package of claim 24, wherein, the coupling means comprises an electrically conductive epoxy.

27. The package of claim 18, wherein a seal ring seals the gaps between the planar rim portions of the first cap and the second cap and the leadframe.

28. The package of claim 27, wherein the seal ring comprises a plurality of sections.

29. The package of claim 27, wherein air fills all gaps in the seal ring.

30. The package of claim 1, wherein the second cap has an outer surface that opposes a cavity formed between the first and second caps and wherein at least a portion of the outer surface is exposed.

* * * * *